United States Patent
Ohto et al.

(10) Patent No.: US 7,132,732 B2
(45) Date of Patent: Nov. 7, 2006

(54) SEMICONDUCTOR DEVICE HAVING TWO DISTINCT SIOCH LAYERS

(75) Inventors: Koichi Ohto, Kanagawa (JP); Tatsuya Usami, Kanagawa (JP); Noboru Morita, Kanagawa (JP); Sadayuki Ohnishi, Kanagawa (JP); Koji Arita, Kanagawa (JP); Ryohei Kitao, Kanagawa (JP); Yoichi Sasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/767,786

(22) Filed: Jan. 29, 2004

(65) Prior Publication Data

US 2004/0183162 A1 Sep. 23, 2004

(30) Foreign Application Priority Data

| Jan. 29, 2003 | (JP) | ................................ 2003-021076 |
| Jan. 27, 2004 | (JP) | ................................ 2004-018079 |

(51) Int. Cl.
*H01L 23/58* (2006.01)
*H01L 23/48* (2006.01)

(52) U.S. Cl. .............. 257/637; 257/635; 257/642; 257/774

(58) Field of Classification Search .............. 257/40, 257/635, 642, 758, 774; 438/618, 629, 637, 438/778, 780, 789, 790, 794
See application file for complete search history.

(56) References Cited

U.S. PATENT DOCUMENTS

| 6,514,855 B1 * | 2/2003 | Suzuki et al. .............. 438/637 |
| 6,559,520 B1 * | 5/2003 | Matsuki et al. ............. 257/642 |
| 6,593,251 B1 * | 7/2003 | Baklanov et al. .......... 438/778 |
| 6,852,651 B1 * | 2/2005 | Shioya et al. ............... 438/790 |
| 6,890,869 B1 * | 5/2005 | Chung ......................... 438/794 |

FOREIGN PATENT DOCUMENTS

| JP | 2002-026121 | 1/2002 |
| JP | 2003-017561 | 1/2003 |

\* cited by examiner

*Primary Examiner*—Ori Nadav
(74) *Attorney, Agent, or Firm*—Scully, Scott, Murphy & Presser, P.C.

(57) ABSTRACT

A semiconductor device has a semiconductor substrate, and a multi-layered wiring arrangement provided thereon. The multi-layered wring arrangement includes at least one insulating layer structure having a metal wiring pattern formed therein. The insulating layer structure includes a first SiOCH layer, a second SiOCH layer formed on the first SiOCH layer, and a silicon dioxide ($SiO_2$) layer formed on the second SiOCH layer. The second SiOCH layer features a carbon (C) density lower than that of the first SiOCH layer, a hydrogen (H) density lower than that of the first SiOCH layer, and an oxygen (O) density higher than that of the first SiOCH layer.

33 Claims, 14 Drawing Sheets

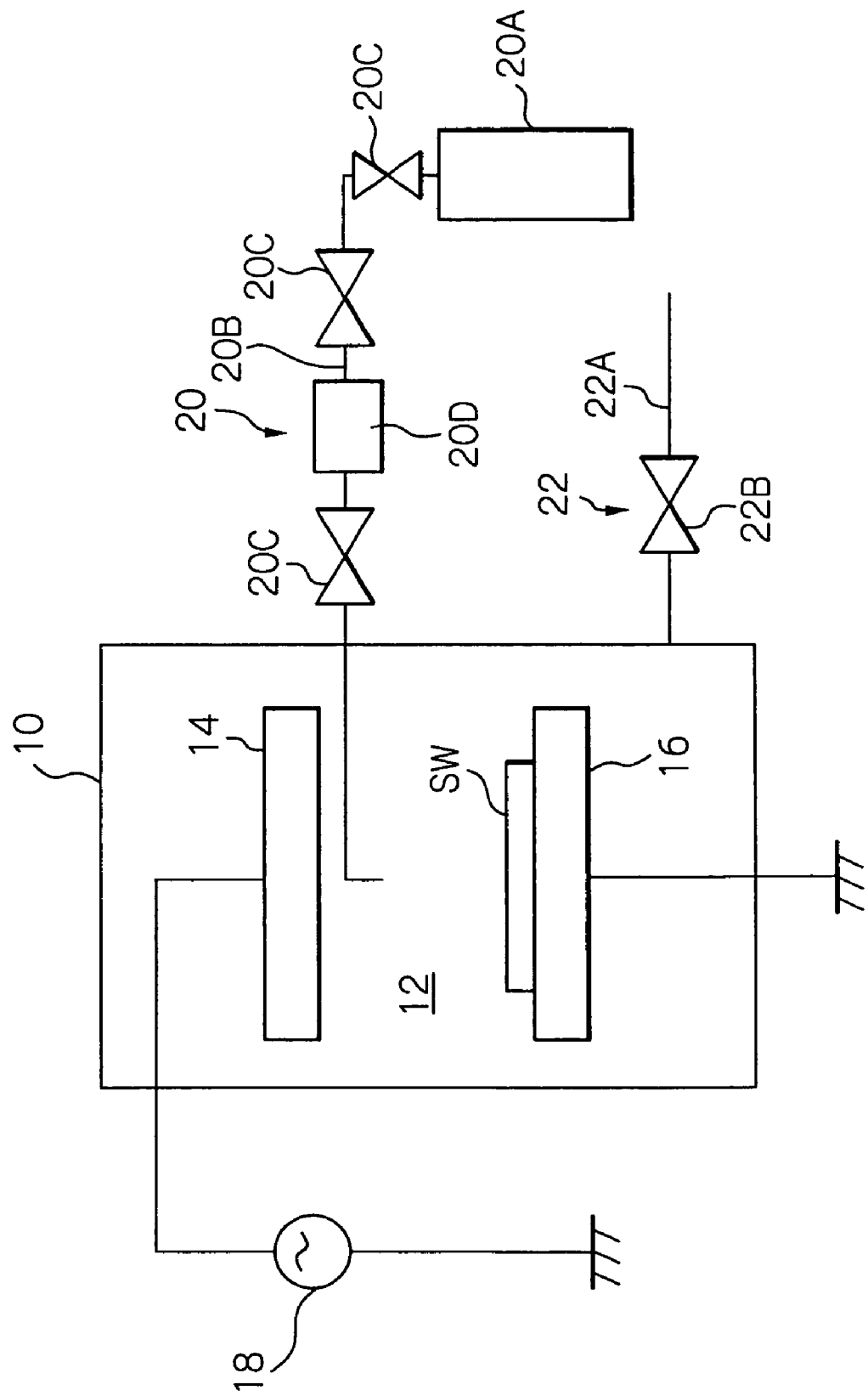

SEMICONDUCTOR DEVICE HAVING TWO DISTINCT SIOCH LAYERS

BACKGROUND OF THE INVENTION

1. Field of the Invention

The present invention relates to a semiconductor device having a multi-layered wiring arrangement produced by using a damascene process, and a production method for manufacturing such a semiconductor device.

2. Description of the Related Art

In a representative process of producing a plurality of semiconductor devices, for example, a silicon wafer is prepared, and a surface of the silicon wafer is sectioned into a plurality of semiconductor chip areas by forming grid-like fine grooves (i.e. scribe lines) in the silicon wafer. Then, the silicon wafer is processed by various well-known methods such that each of the semiconductor chip areas is produced as a semiconductor device, and an insulating layer is formed as an underlayer on the semiconductor devices produced in the silicon wafer. A plurality of metal plugs are formed in an area of the insulating underlayer, which corresponds to each of the semiconductor devices, with the metal plugs being electrically connected to a corresponding semiconductor device.

Subsequently, a multi-layered wiring arrangement is formed on the insulating underlayer of the silicon wafer, using various processes, for example, a chemical vapor deposition (CVD) process, a photolithography process, an etching process, a sputtering process, an electroplating process, and so on. The multi-layered wiring arrangement includes a lowermost insulating layer structure formed on the insulating underlayer of the silicon wafer and having a plurality of metal wiring patterns formed therein, an uppermost insulating layer structure having a plurality of metal wiring patterns formed therein, and at least one intermediate insulating layer structure or insulating interlayer structure provided between the lowermost and uppermost insulating layer structures and having a plurality of metal wiring patterns. Conventionally, each of the lowermost and uppermost insulating layer structures is formed as a silicon dioxide layer by the CVD process, and the insulating interlayer structure is also formed as a silicon dioxide layer by the CVD process.

Each of the metal wiring patterns included in the lowermost insulating layer structure is electrically connected to the metal plugs provided for a corresponding semiconductor device. Also, each of the metal wiring patterns included in the insulating interlayer structure is electrically connected to a corresponding metal wiring pattern of the lowermost insulating layer structure through the intermediary of via-plugs formed in the insulating interlayer structure. Further, each of the metal wiring patterns included in the uppermost insulating layer structure is electrically connected to a corresponding metal wiring pattern of the insulating interlayer structure through the intermediary of via-plugs formed in the uppermost insulating layer structure.

With the recent advance of miniaturization of semiconductor devices, a signal-transmission path included in each metal wiring pattern becomes narrower. Of course, the narrower the signal-transmission path, the larger resistance of the signal-transmission path, resulting in delay of signal transmission in the signal-transmission path. Conventionally, in general, although the metal wiring patterns are formed of aluminum, there is a recent trend toward use of copper, exhibiting a smaller specific resistance than that of aluminum, for the metal wiring pattern, whereby the signal transmission can be facilitated in the signal-transmission paths of the metal wiring pattern.

Also, the signal-transmission paths included in each metal wiring pattern become closer to each other for the miniaturization of semiconductor devices, and thus a parasitic capacitance is produced between adjacent signal-transmission paths because the silicon dioxide layer serves as a dielectric therebetween. Of course, the production of the parasitic capacitance results in delay of signal transmission in the signal-transmission paths. In short, the miniaturization of the semiconductor devices has advanced to a degree in which a magnitude of a dielectric constant of the silicon dioxide layer cannot be neglected.

Thus, in the production of the semiconductor devices, it has been proposed that an insulating layer, composed of a low-k material having a smaller dielectric constant than that of silicon dioxide, be substituted for the silicon dioxide insulating layer, to thereby suppress the production of the parasitic capacitance. Note, for the low-k material, SiOCH is representatively used.

In general, since it is difficult to minutely process a copper layer by using a dry etching process to thereby produce a copper wiring pattern, a damascene process is used for the production of the minute copper wiring pattern, as disclosed in, for example, JP-A-2002-026121 and JP-A-2003-017561.

In the production of the aforesaid multi-layered wiring arrangement by using the damascene process, a SiOCH insulating layer is exposed to an oxidizing atmosphere, and thus it is difficult to completely substitute the SiOCH insulating layer for the silicon dioxide insulating layer, because the SiOCH insulating layer exhibits an oxidation resistance property which is inferior to that of the silicon dioxide insulating layer. Namely, the SiOCH insulating layer is liable to be oxidized due to a carbon component (C) contained therein.

Accordingly, in the damascene process, after the SiOCH insulating layer is formed, a thin silicon dioxide insulating layer is further formed as a protective layer over the SiOCH insulating layer. However, an adhesion strength is relatively low in an interface between the SiOCH insulating layer and the thin silicon dioxide insulating layer, due to existence of Si—CH$_3$ bonds on the interfacial surface of the SiOCH insulating layer, and thus both the layers are liable to be separated from each other. Further, when the SiOCH insulating layer and the silicon dioxide insulating layer are formed by a plasma chemical vapor deposition (CVD) process, a tensile stress is produced in the SiOCH insulating layer, whereas a compression stress is produced in the silicon dioxide insulating layer. Thus, both the layers are further liable to be separated from each other.

In order to improve the oxidation resistance property of the SiOCH insulating layer and the adhesion property in the interface between SiOCH insulating layer and the thin silicon dioxide insulating layer, it has been proposed that the surface of the SiOCH insulating layer be subjected to a plasma treatment using a plasma gas containing oxygen (O), to thereby reform and modify the surface of the SiOCH insulating layer before the formation of the thin silicon dioxide insulating layer, as disclosed in the aforesaid JP-A-2002-026121. However, this plasma treatment is unsatisfactory in that it is difficult to reform and modify only a surface section of the SiOCH insulating layer. Namely, when the SiOCH insulating layer is treated with the plasma gas containing oxygen (O), it can be wholly reformed and modified, due to the poor oxidation resistance property of the SiOCH insulating layer. In other words, it is very difficult to control the plasma treatment such that only the surface section of the SiOCH insulating layer is reformed and modified.

On the other hand, the aforesaid JP-A-2003-017561 discloses a plasma treatment using a reducing gas for reforming and modifying the surface section of the SiOCH insulating layer. When a gas containing nitrogen (N), such as an $N_2$ gas, an $NH_3$ gas or the like, is used as the reducing gas, the SiOCH insulating layer is nitrided, resulting in a rise in the dielectric constant of the SiOCH insulating layer.

Also, when a hydrogen ($H_2$) gas is used as the reducing gas, it is possible to increase desirable Si—H bonds in the surface section of the SiOCH insulating layer. Nevertheless, the hydrogen atoms (H) are liable to be separated from the Si—H bonds in a post-treatment, because the Si—H bonds are thermally unstable. Further, since the hydrogen atoms (H) can be easily diffused in the SiOCH insulating layer, it is very difficult to reform and modify only the surface section of the SiOCH insulating layer. In addition, since the methyl radicals ($CH_3$—) are decreased from the reformed and modified surface section of the SiOCH insulating layer, it exhibits a high moisture-absorption characteristic. Of course, it is undesirable that the reformed and modified surface section of the SiOCH insulating layer contains moisture.

SUMMARY OF THE INVENTION

Therefore, an object of the present invention is to provide a semiconductor device having a multi-layered wiring arrangement including at least a SiOCH insulating layer covered with a thin silicon dioxide layer, in which it is possible to considerably improve an adhesion strength in an interface between the SiOCH insulating layer and the thin silicon dioxide insulating layer.

Another object of the present invention is to provide a production method for reliably and stably manufacturing such a semiconductor device.

In accordance with a first aspect of the present invention, there is provided a semiconductor device comprising: a semiconductor substrate, and a multi-layered wiring arrangement provided on the semiconductor substrate, the multi-layered wring arrangement including at least one insulating layer structure having a metal wiring constitution formed therein. The insulating layer structure includes a first SiOCH layer, a second SiOCH layer formed on the first SiOCH layer, and a silicon dioxide ($SiO_2$) layer formed on the second SiOCH layer, and the second SiOCH layer features a carbon (C) density lower than that of the first SiOCH layer, a hydrogen (H) density lower than that of the first SiOCH layer, and an oxygen (O) density higher than that of the first SiOCH layer.

Preferably, the first SiOCH layer features a carbon (C) density falling in a range between 10 atoms % and 20 atoms %, an oxygen (O) density falling in a range between 20 atoms % and 35 atoms %, and a hydrogen (H) density of more than 25 atoms %, and the second SiOCH layer features a carbon (C) density of less than 10 atoms %, an oxygen (O) density of more than 35 atoms %, and a hydrogen (H) density of less than 25 atoms %.

When the insulating layer structure has a trench pattern formed therein, the metal wiring constitution comprises a metal wiring pattern buried in the trench pattern. Preferably, the metal wiring pattern is made of copper (Cu), and a barrier metal layer is formed on wall faces defining the trench pattern to thereby prevent diffusion of copper atoms from the copper wiring pattern into the insulating layer structure.

When the insulating layer structure has at least one hole formed therein, the metal wiring constitution comprises a metal via-plug buried in the hole. Preferably, the metal via-plug is made of copper (Cu), and a barrier metal layer is formed on wall faces defining the hole to thereby prevent diffusion of copper atoms from the copper via-plug into the insulating layer structure.

When the insulating layer structure has a trench pattern (108) formed therein, and at least one hole formed in a bottom of the trench pattern, and the metal wiring constitution comprises a metal wiring pattern buried in the trench pattern, and a metal via-plug buried in the hole. Preferably, the metal wiring pattern and the metal via-plug are made of copper (Cu), and a barrier metal layer is formed on wall faces defining both the trench pattern and the hole to thereby prevent diffusion of copper atoms from the copper wiring pattern and the copper via-plug into the insulating layer structure.

The barrier metal layer may have a single-layered structure, which is formed of one selected from a group consisting of titanium (Ti), a titanium compound, tantalum (Ta), and a tantalum compound. The titanium compound may be either titanium nitride (TiN) or titanium silicon nitride (TiSiN), and the tantalum compound (Ta) may be either tantalum nitride (TaN) or tantalum silicon nitride (TaSiN).

Also, the barrier metal layer may have a multi-layered structure, which is formed of more than one selected from a group consisting of titanium (Ti), a titanium compound, tantalum (Ta), and a tantalum compound. The titanium compound may be either titanium nitride (TiN) or titanium silicon nitride (TiSiN), and the tantalum compound (Ta) may be either tantalum nitride (TaN) or tantalum silicon nitride (TaSiN).

Preferably, the insulating layer structure further includes a barrier insulating layer on which the first SiOCH layer is formed, and the barrier insulating layer prevents diffusion of copper atoms into the first SiOCH layer when the insulating layer structure is formed on another insulating layer structure having a copper wiring constitution. The barrier insulating layer may have a single-layered structure comprising either a SiCNH layer or a SiCH layer. Also, the barrier insulating layer may have a multi-layered structure comprising a SiCNH layer and a SiCH layer. Further, the barrier insulating layer may have a multi-layered structure comprising a SiCNH layer, and a SiOCNH layer formed thereon. In addition, the barrier insulating layer may be a multi-layered structure comprising a SiCNH layer, and a SiCH layer formed thereon.

Preferably, the copper wiring pattern contains at least one anti-migration substance selected from a group consisting of silicon (Si), aluminum (Al), tungsten (W), magnesium (Mg), beryllium (Be), zinc (Zn), lead (Pb), cadmium (Cd), gold (Au), mercury (Hg), platinum (Pt), zirconium (Zr), titanium (Ti), tin (Sn), nickel (Ni), and iron (Fe).

In accordance with a second aspect of the present invention, there is provided a method of manufacturing a semiconductor device, which comprises the steps of: preparing a semiconductor substrate on which a multi-layered wiring arrangement be provided; and forming at least one insulating layer structure, having a metal wiring constitution, to thereby construct the multi-layered wiring arrangement. The formation of the insulating layer structure comprises the steps of: producing a first SiOCH layer; treating a surface section of the first SiOCH layer such that the surface section of the first SiOCH layer is produced and defined as a second SiOCH layer which features a carbon (C) density lower than that of the first SiOCH layer, a hydrogen (H) density lower than that of the first SiOCH layer, and an oxygen (O) density higher than that of the first SiOCH layer; forming a silicon dioxide ($SiO_2$) layer on the second SiOCH layer; and forming the metal wiring constitution in the first and second SiOCH layers and the silicon dioxide ($SiO_2$) layer.

The first SiOCH layer features a carbon (C) density falling in a range between 10 atoms % and 20 atoms %, an oxygen (O) density falling in a range between 20 atoms % and 35 atoms %, and a hydrogen (H) density of more than 25 atoms %, and the second SiOCH layer features a carbon (C) density of less than 10 atoms %, an oxygen (O) density of more than 35 atoms %, and a hydrogen (H) density of less than 25 atoms %.

The treatment of the surface section of the first SiOCH layer may be carried out by reforming and modifying the surface section with a plasma treatment using a first gas from which oxygen (O), hydrogen (H), and nitrogen (N) are excluded, and with a thermal oxidization treatment using a second gas including oxygen (O). The first gas may comprise a helium (He) gas, an inert gas, such as an argon gas (Ar), or the like. The second gas may comprise at least one selected from a group consisting of an oxygen ($O_2$) gas, an ozone ($O_3$) gas, a nitrous oxide ($N_2O$) gas, an nitrogen monoxide (NO) gas, a carbon monoxide (CO) gas, and a carbon dioxide ($CO_2$) gas.

Preferably, both the treatment of the surface section of the first SiOCH layer and the formation of the silicon dioxide ($SiO_2$) layer are carried out in a closed vessel defining a processing chamber without the first SiOCH layer's being exposed to the atmosphere.

BRIEF DESCRIPTION OF THE DRAWINGS

The above objects and other objects will be more clearly understood from the description set forth below, with reference to the accompanying drawings, wherein:

FIG. 1 is a schematic conceptual view showing a parallel-type plasma chemical vapor deposition apparatus used to manufacture semiconductor devices according to the present invention;

DESCRIPTION OF THE PREFERRED EMBODIMENTS

Figure 2A:
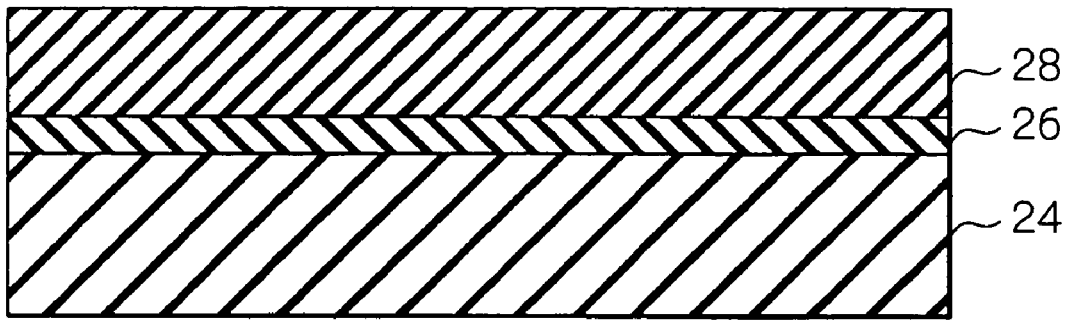
FIG. 2A is a partial cross-sectional view of an insulating underlayer formed on a semiconductor substrate, showing a first representative step of a first embodiment of a production method for manufacturing a semiconductor device according to the present invention.

With reference to FIG. 1, a parallel-type plasma chemical vapor deposition (CVD) apparatus is schematically and conceptually illustrated. This CVD apparatus is used to manufacture semiconductor devices according to the present invention.

As shown in FIG. 1, the CVD apparatus includes a closed vessel 10 defining a processing chamber 12, a plate-like upper electrode 14 provided in the processing chamber 12, and a susceptor 16 arranged below the plate-like upper electrode 14. The CVD apparatus is provided with a radio frequency (RF) source 18 for supplying an RF power to the upper electrode 14. The susceptor 16 forms a lower electrode opposed to the upper electrode 14, and has an electric heater (not visible) incorporated therein. A semiconductor substrate to be processed, such as a silicon wafer SW, is mounted on a top surface of the susceptor or lower electrode 16, which is grounded, as shown in FIG. 1.

The CVD apparatus is also provided with a gas supply system 20 for supplying various reaction gases to the processing chamber 12. The gas supply system 20 includes various gas sources, represented by one block 20A, for storing a helium gas (He), a nitrous oxide gas ($N_2O$), a silane gas ($SiH_4$) and so on, various gas supply pipes, represented by a single line 20B, for supplying the gases to the processing chamber 12, valves 20C provided in each of the gas supply pipes 20B, and a gas flow rate controller 20D provided in each of the gas supply pipes 20B to thereby regulate a flow rate of gas to be supplied to the processing chamber 12.

The CVD apparatus is further provided with a gas exhaust system 22 for exhausting waste gases from the processing chamber 12 to the outside. The gas exhaust system 22 includes an exhaust pipe 22A, and an exhaust control valve 22B provided in the exhaust pipe 22A to control an internal pressure in the processing chamber 12.

Note, although not illustrated in FIG. 1, the CVD apparatus is provided with a computer for controlling the RF source 18, the electric heater incorporated in the lower electrode 16, the gas flow rate controller, the exhaust control valve 22B, and so on.

FIGS. 2A to 2L show a first embodiment of a production method for manufacturing semiconductor devices according to the present invention. Note, in this first embodiment, a multi-layered wiring arrangement of each semiconductor device is formed, using a single-damascene process.

With reference to FIG. 2A, reference 24 indicates an insulating underlayer formed on a semiconductor substrate or silicon wafer, as indicated by reference SW in FIG. 1, in which a plurality of semiconductor devices are produced. Note, although not illustrated in FIG. 2A, a plurality of metal plugs are formed in an area of the insulating underlayer 24 corresponding to each of the semiconductor devices, and are electrically connected to various active regions formed in a corresponding semiconductor device.

As shown in FIG. 2A, first, a SiCNH layer 26 having a thickness of approximately 50 nm is formed as an insulating layer on the insulating underlayer 24, using a suitable plasma CVD process. Then, a SiOCH layer 28 having a thickness of approximately 250 nm is formed as an insulating layer on the SiCNH layer 26, using either a suitable plasma CVD process or a coating/baking process.

After the formation of the SiOCH layer 28 is completed, the silicon wafer SW, carrying the underlayer 24, the SiCNH layer 26, and the SiOCH layer 28, is mounted on the susceptor or lower electrode 16 of the CVD apparatus shown in FIG. 1, and a surface section of the SiOCH layer 28 is subjected to a He-plasma treatment using He-plasma, which is produced under the conditions as follows:

processing temperature: 200 to 450° C.;
flow rate of He gas: 10 to 6,000 sccm;
processing pressure: 1 to 20 Torr; and
RF power: 50 to 500 W.

Thus, a part of the Si—$CH_3$ bonds and a part of Si—H bonds are released to thereby produce dangling bonds in a surface section of the SiOCH layer 28.

Then, the surface section of the SiOCH layer 28 is further subjected to a thermal oxidization treatment using $N_2O$-plasma, which is produced under the conditions as follows:

processing temperature: 200 to 450° C.;
flow rate of $N_2O$ gas: 100 to 6,000 sccm;
processing pressure: 1 to 20 Torr; and
RF power: 50 to 500 W.

Figure 2B:
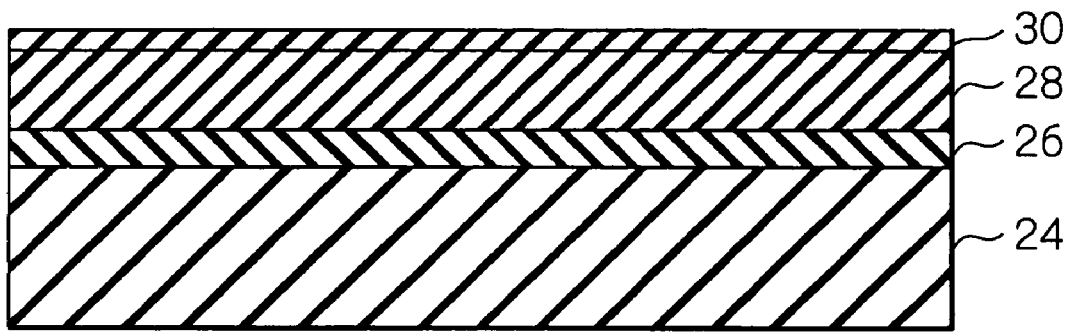
FIG. 2B is a partial cross-sectional view, similar to FIG. 2A, showing a second representative step of the first embodiment of the production process according to the present invention.

Thus, as shown in FIG. 2B, the surface section of the SiOCH layer 28 is reformed and modified as a second SiOCH layer 30, in which a carbon (C) density and a hydrogen (H) density are lowered, and in which an oxygen (O) density is raised. Under the aforesaid conditions, the second SiOCH layer 30 has a thickness of approximately 20 nm. Note, for the sake of convenience of explanation, the remaining section of the SiOCH layer 28 is defined as a first SiOCH layer 28.

Figure 2C:
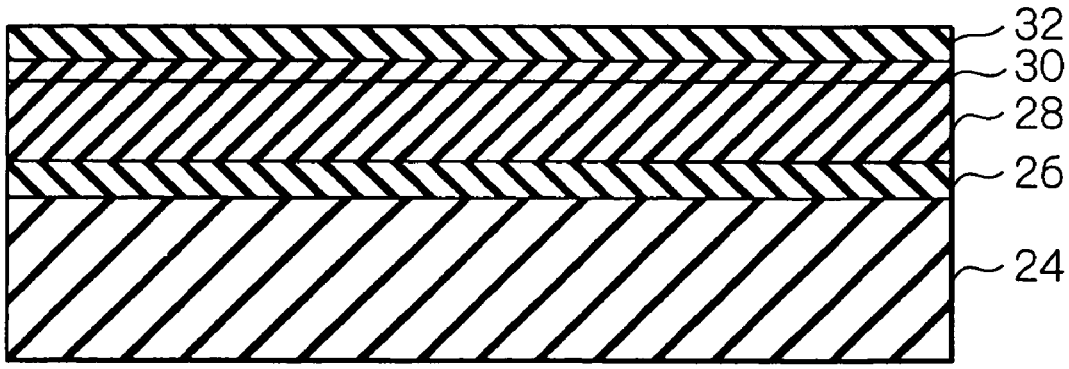
FIG. 2C is a partial cross-sectional view, similar to FIG. 2B, showing a third representative step of the first embodiment of the production process according to the present invention.

Subsequently, as shown in FIG. 2C, a silicon dioxide ($SiO_2$) layer 32 is formed as an insulating layer on the second SiOCH layer 30 by the plasma CVD apparatus shown in FIG. 1 under the conditions as follows:

processing temperature: 200 to 450° C.;
flow rate of $N_2O$ gas: 100 to 6,000 sccm;
flow rate of $SiH_4$ gas: 10 to 1,000 sccm;
processing pressure: 1 to 20 Torr; and
RF power: 50 to 500 W.

Figure 2D:
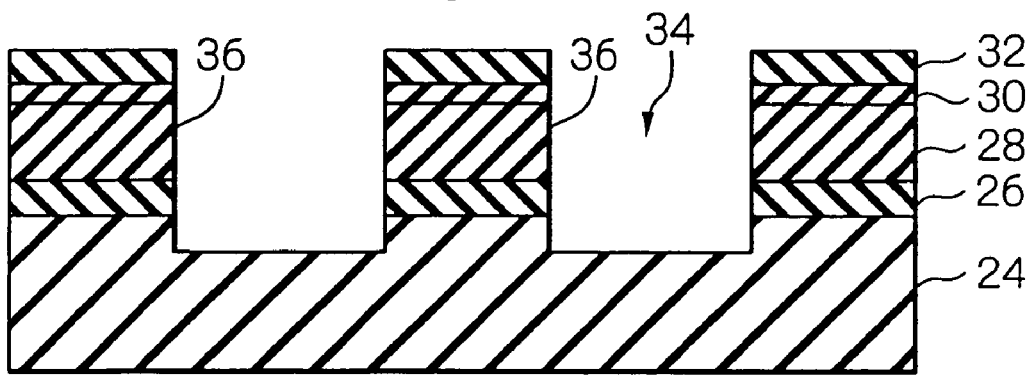
FIG. 2D is a partial cross-sectional view, similar to FIG. 2C, showing a fourth representative step of the first embodiment of the production process according to the present invention.

After the formation of the $SiO_2$ layer 32 is completed, the silicon wafer SW is taken out of the plasma CVD apparatus shown in FIG. 1. Then, as shown in FIG. 2D, a trench pattern 34, corresponding to a wiring pattern to be formed, is formed in the insulating layers 24, 26, 28, 30, and 32, using a photolithography process and a dry etching process. The trench pattern 34 is formed by a plurality of fine trenches 36 corresponding to conductive paths included in the wiring pattern to be formed. Note, in this case, since the SiCNH layer 26 functions as an etching stopping layer, it is possible to accurately carry out the formation of the trench pattern 34.

Figure 2E:
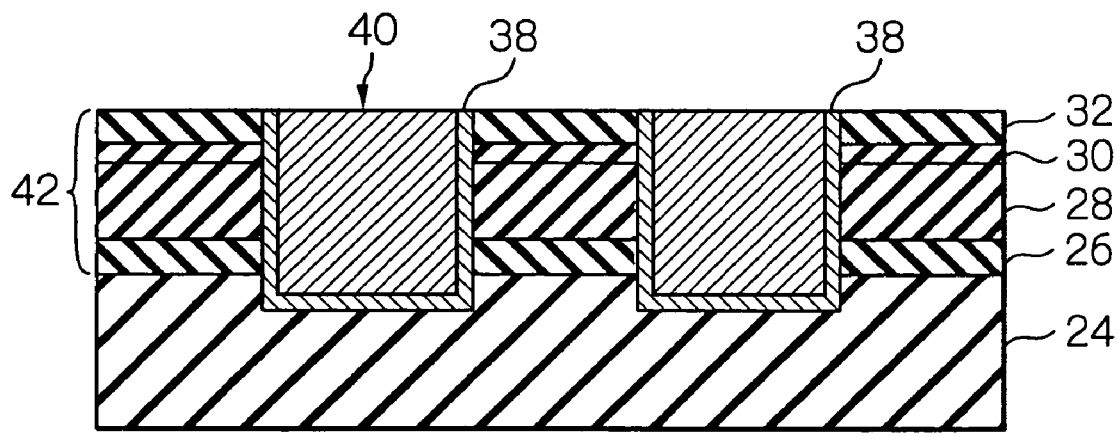
FIG. 2E is a partial cross-sectional view, similar to FIG. 2D, showing a fifth representative step of the first embodiment of the production process according to the present invention.

After the formation of the trench pattern 34 is completed, as shown in FIG. 2E, a tantalum/tantalum nitride (Ta/TaN) layer 38 having a thickness of approximately 30 nm is formed as a metal barrier layer on a side wall face and a bottom wall face defining each of the fine trenches 36. Then, a copper (Cu) layer having a thickness of approximately 100 nm is formed on the Ta/TaN layer 38, using a sputtering process. Subsequently, the fine trenches 36 are filled with copper (Cu), using an electroplating process in which the aforesaid Cu layer serves as a cathode electrode, and the filled copper (Cu) is subjected to an annealing process for crystallization at a temperature falling in a range between 200° C. and 400° C.

After the annealing process is completed, the silicon wafer SW is set in a chemical mechanical polishing (CMP) apparatus, the surface of the $SiO_2$ layer 32 is chemically and mechanically polished so that the redundant metals (Ta, TaN, Cu) are removed therefrom, resulting in formation of a copper wiring pattern 40 in the insulating layers 26, 28, 30, and 32, as shown in FIG. 2E. Namely, the insulating layers 26, 28, 30, and 32 define a lowermost insulating layer structure of the aforesaid multi-layered wiring arrangement, indicated by reference 42, in which the copper wiring pattern 40 is formed.

Note, of course, the metal barrier (Ta/TaN) layer 38 is provided for preventing diffusion of copper atoms (Cu) from the copper wiring pattern 40 into the insulating layers 24, 26, 28, 30, and 32.

Figure 2F:
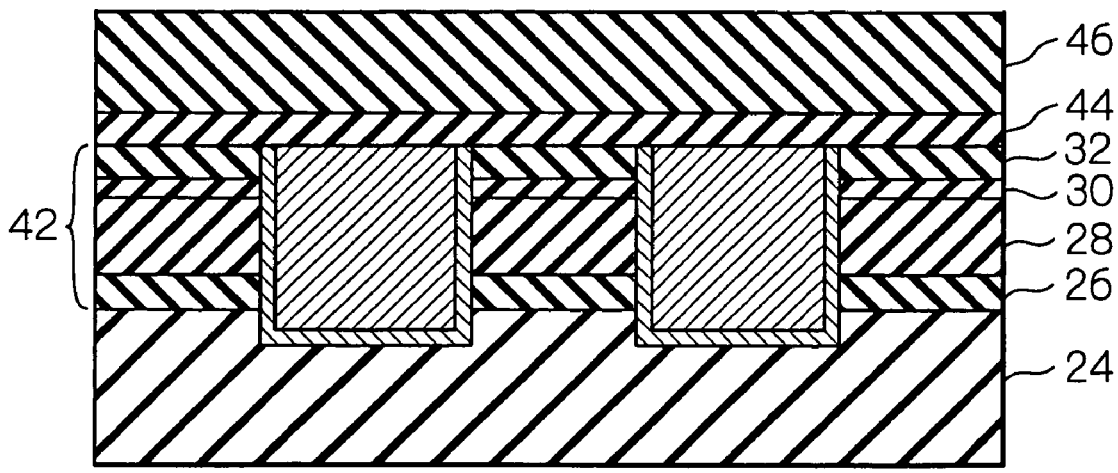
FIG. 2F is a partial cross-sectional view, similar to FIG. 2E, showing a sixth representative step of the first embodiment of the production process according to the present invention.

Next, as shown in FIG. 2F, a SiCNH layer 44 having a thickness of approximately 50 nm is formed as an insulating layer on the lowermost insulating layer structure 42 in substantially the same manner as the SiCNH layer 26. Then, a SiOCH layer 46 having a thickness of approximately 250 nm is formed as an insulating layer on the SiCNH layer 44 in substantially the same manner as the SiOCH layer 28. Note, the SiCNH layer 44 functions as a barrier insulating layer for preventing diffusion of the copper atoms (Cu) from the copper wiring pattern 40 into the first SiOCH layer 46.

Figure 2G:
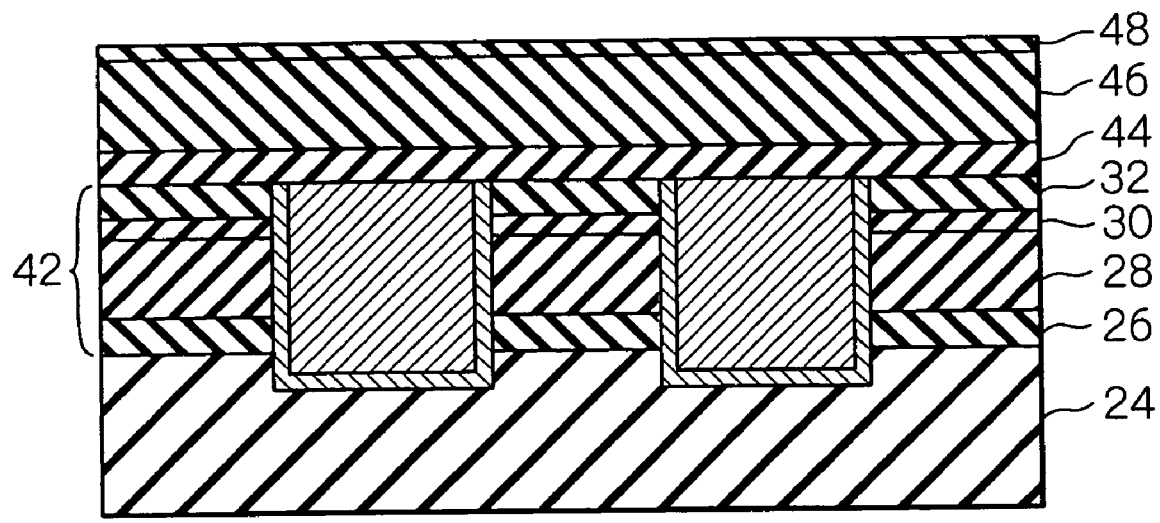
FIG. 2G is a partial cross-sectional view, similar to FIG. 2F, showing a seventh representative step of the first embodiment of the production process according to the present invention.

After the formation of the SiOCH layer 46 is completed, the silicon wafer SW is again mounted on the lower electrode 16 of the CVD apparatus shown in FIG. 1, and a surface section of the SiOCH layer 46 is subjected to substantially the same He-plasma treatment and thermal oxidization treatment as mentioned above. Thus, as shown in FIG. 2G, the surface section of the SiOCH layer 46, having a thickness of approximately 20 nm, is reformed and modified as a second SiOCH layer 48, in which a carbon (C) density and a hydrogen (H) density are lowered, and in which an oxygen (O) density is raised. Note, similar to the above-mentioned case, the remaining section of the SiOCH layer 46 is defined as a first SiOCH layer 46.

Figure 2H:
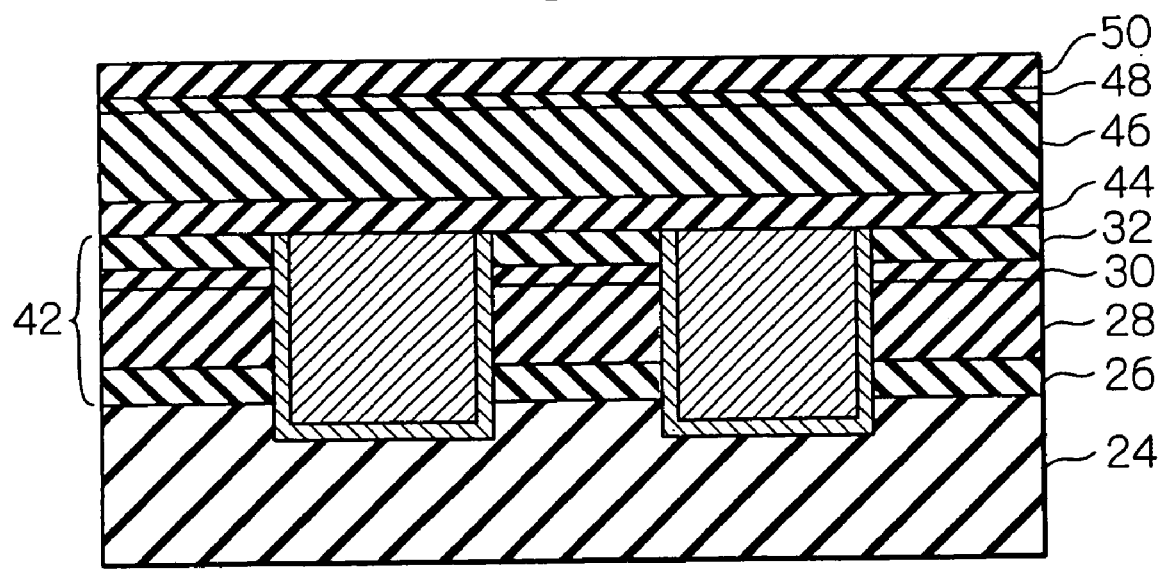
FIG. 2H is a partial cross-sectional view, similar to FIG. 2G, showing an eighth representative step of the first embodiment of the production process according to the present invention.
Figure 2I:
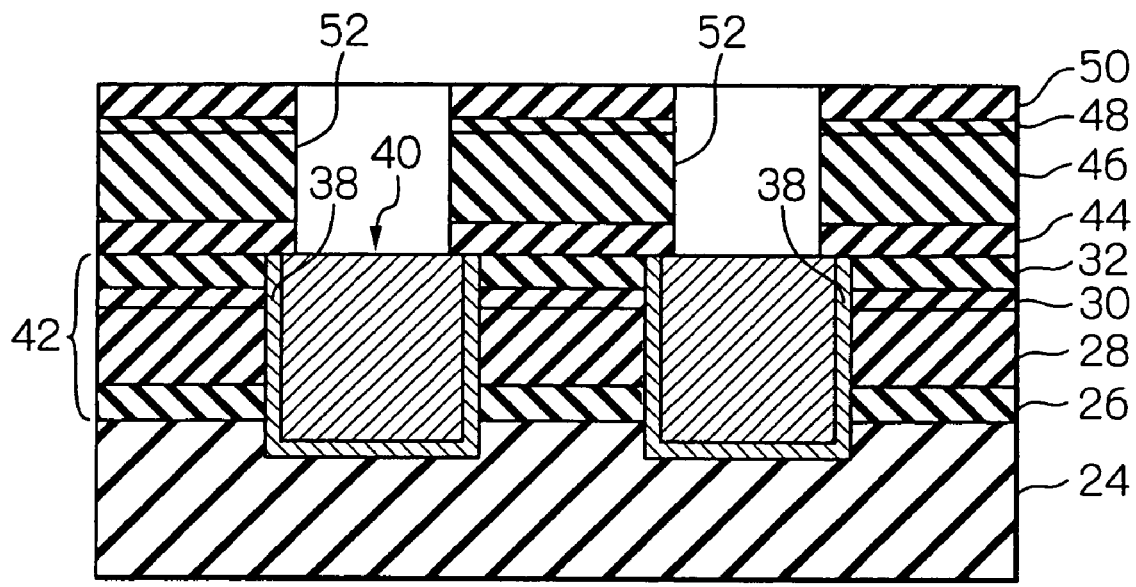
FIG. 2I is a partial cross-sectional view, similar to FIG. 2H, showing a ninth representative step of the first embodiment of the production process according to the present invention.

Subsequently, as shown in FIG. 2H, a silicon dioxide ($SiO_2$) layer 50 having a thickness of approximately 100 nm is formed as an insulating layer on the second SiOCH layer 48 by the plasma CVD apparatus shown in FIG. 1 in substantially the same manner as the $SiO_2$ layer 32.

After the formation of the $SiO_2$ layer 50 is completed, the silicon wafer SW is taken out of the plasma CVD apparatus shown in FIG. 1. Then, as shown in FIG. 2D, a plurality of fine holes 52 are formed in the insulating layers 44, 46, 48, and 50, using a photolithography process and a dry etching process, such that a predetermined location of the copper wiring pattern 40 is exposed by each of the fine holes 52. Note, during the formation of the holes 52 by the dry etching process, the SiCNH layer 44 also functions as an etching stopping layer, whereby it is possible to accurately carry out the formation of the fine holes 52.

Figure 2J:
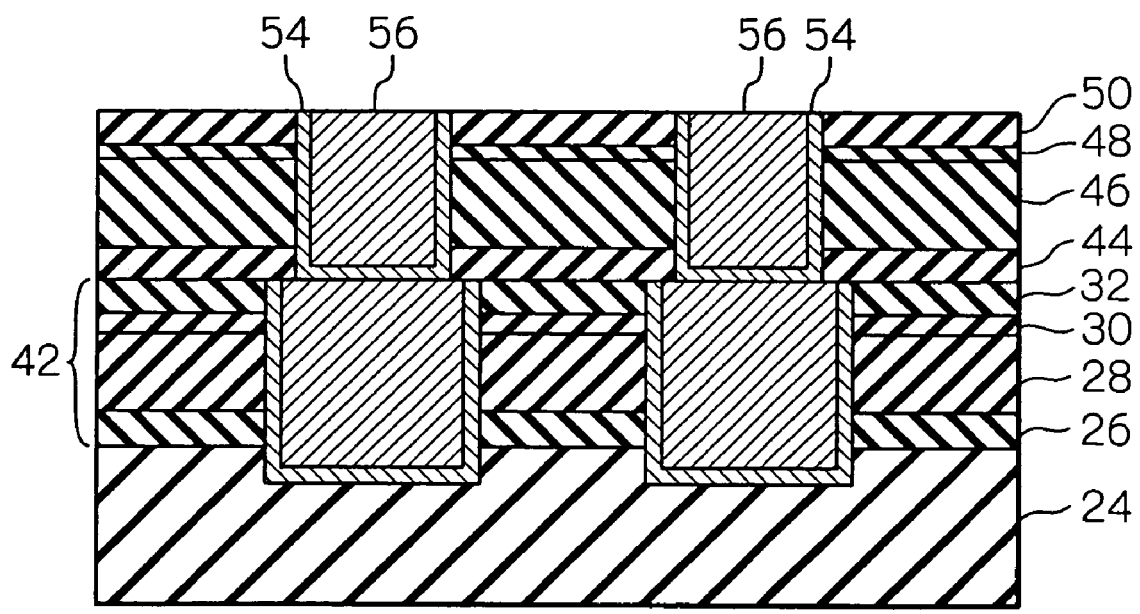
FIG. 2J is a partial cross-sectional view, similar to FIG. 2I, showing a tenth representative step of the first embodiment of the production process according to the present invention.

After the formation of the fine holes 52 is completed, as shown in FIG. 2J, a tantalum/tantalum nitride (Ta/TaN) layer 54 having a thickness of approximately 30 nm is formed as a barrier metal layer on a side wall face and a bottom wall face defining each of the fine holes 52. Then, a copper (Cu) layer having a thickness of approximately 100 nm is formed on the Ta/TaN layer 54, using a sputtering process. Subsequently, the fine holes 52 are filled with copper (Cu), using an electroplating process in which the aforesaid Cu layer serves as a cathode electrode, and the filled copper (Cu) is subjected to an annealing process for crystallization at a temperature falling in a range between 200° C. and 400° C.

After the annealing process is completed, the silicon wafer SW is set in the aforesaid CMP apparatus, the surface of the $SiO_2$ layer 50 is chemically and mechanically polished so that the redundant metals (Ta, TaN, Cu) are removed therefrom, resulting in formation of copper via-plugs 56 in the insulating layers 44, 46, 48, and 50, as shown in FIG. 2J. As is apparent from FIG. 2J, the copper via-plugs 56 are electrically connected to the copper wiring pattern 40 formed in the lowermost insulating layer structure 42.

Figure 2K:
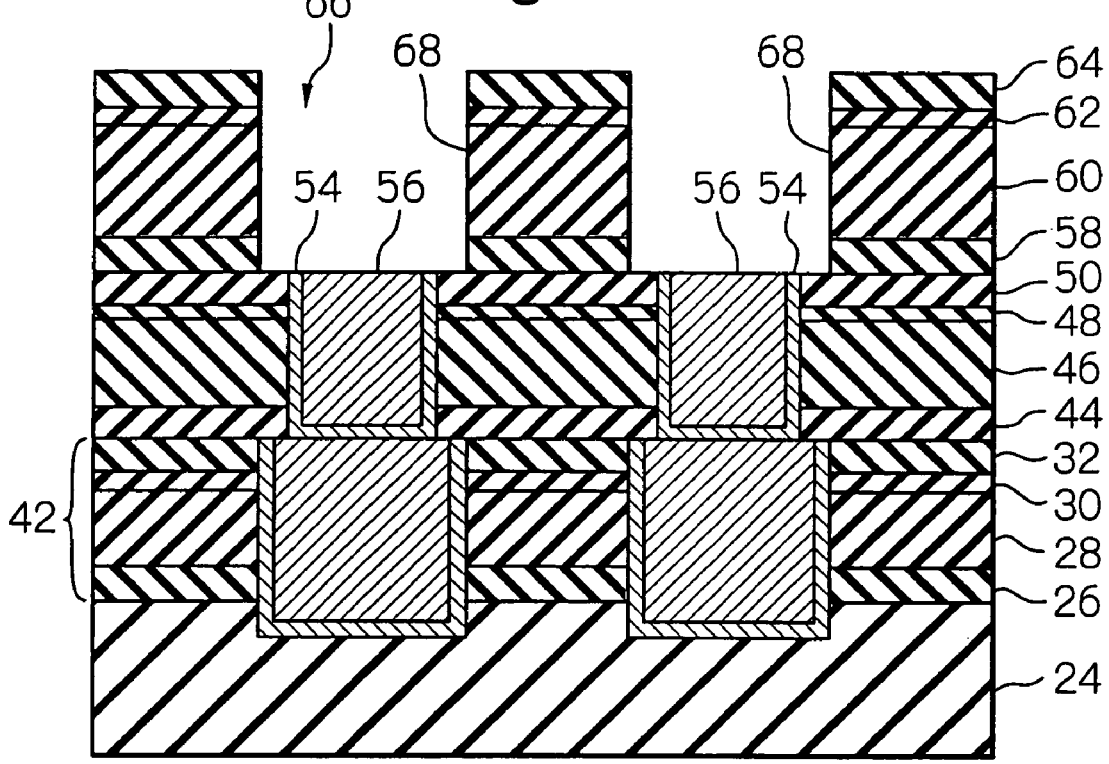
FIG. 2K is a partial cross-sectional view, similar to FIG. 2J, showing an eleventh representative step of the first embodiment of the production process according to the present invention.

Thereafter, as shown in FIG. 2K, a SiCNH layer 58 having a thickness of approximately 50 nm is further formed as an insulating layer on the $SiO_2$ layer 50 in substantially the same manner as the SiCNH layers 26 and 44. Then, a SiOCH layer 60 having a thickness of approximately 250 nm is formed as an insulating layer in substantially the same manner as the SiOCH layers 28 and 46. Note, the SiCNH layer 58 functions as a barrier insulating layer for preventing diffusion of the copper atoms (Cu) from the copper via-plugs 56 into the first SiOCH layer 60.

After the formation of the SiOCH layer 60 is completed, the silicon wafer SW is again mounted on the lower electrode 16 of the CVD apparatus shown in FIG. 1, and a surface section of the SiOCH layer 60 is subjected to substantially the same He-plasma treatment and thermal oxidization treatment as mentioned above. Thus, the surface section of the SiOCH layer 60, having a thickness of approximately 20 nm, is reformed and modified as a second SiOCH layer 62 (FIG. 2K), in which a carbon (C) density and a hydrogen (H) density are lowered, and in which an oxygen (O) density is raised. Note, similar to the above-mentioned cases, the remaining section of the SiOCH layer 60 is defined as a first SiOCH layer 60.

Subsequently, as shown in FIG. 2K, a silicon dioxide ($SiO_2$) layer 64 having a thickness of approximately 100 nm is formed as an insulating layer on the second SiOCH layer 62 by the plasma CVD apparatus shown in FIG. 1 in substantially the same manner as the $SiO_2$ layers 32 and 50.

After the formation of the SiO$_2$ layer 64 is completed, the silicon wafer SW is taken out of the plasma CVD apparatus shown in FIG. 1. Then, as shown in FIG. 2K, a trench pattern 66, corresponding to a wiring pattern to be formed, is formed in the insulating layers 58, 60, 62, and 64, using a photolithography process and a dry etching process. The trench pattern 66 is formed by a plurality of fine trenches 68 corresponding to conductive paths included in the wiring pattern to be formed. Note, since the SiCNH layer 58 also functions as an etching stopping layer, it is possible to accurately carry out the formation of the trench pattern 66.

Figure 2L:
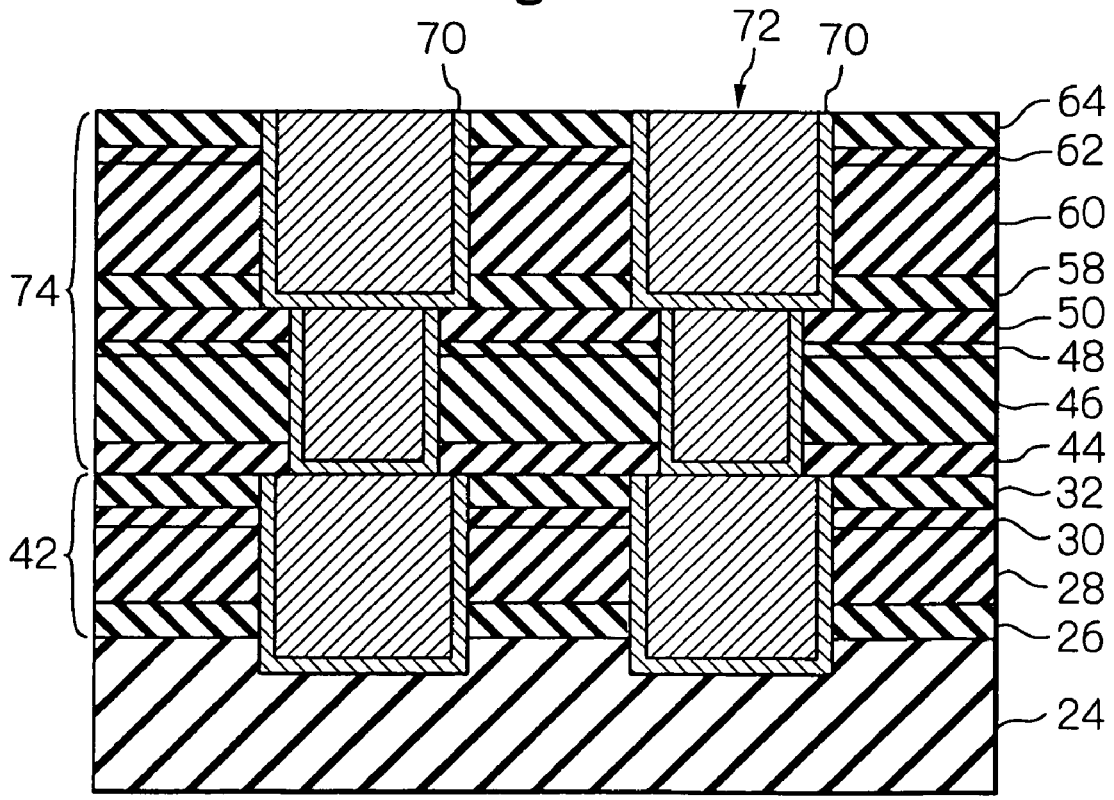
FIG. 2L is a partial cross-sectional view, similar to FIG. 2K, showing a twelfth representative step of the first embodiment of the production process according to the present invention.

After the formation of the trench pattern 66 is completed, as shown in FIG. 2L, a tantalum/tantalum nitride (Ta/TaN) layer 70 having a thickness of approximately 30 nm is formed as a barrier metal layer on a side wall face and a bottom wall face defining each of the fine trenches 68. Then, a copper (Cu) layer having a thickness of approximately 100 nm is formed on the Ta/TaN layer 70, using a sputtering process. Subsequently, the fine trenches 68 are filled with copper (Cu), using an electroplating process in which the aforesaid Cu layer serves as a cathode electrode, and the filled copper (Cu) is subjected to an annealing process for crystallization at a temperature falling in a range between 200° C. and 400° C.

After the annealing process is completed, the silicon wafer SW is set in the aforesaid CMP apparatus, the surface of the SiO$_2$ layer 64 is chemically and mechanically polished so that the redundant metals (Ta, TaN, Cu) are removed therefrom, resulting in formation of a copper wiring pattern 72 in the insulating layers 58, 60, 62, and 64, as shown in FIG. 2L. As is apparent from FIG. 2L, the copper wiring pattern 72 is electrically connected to the copper wiring pattern 40 (FIG. 2E) through the intermediary of the via-plugs 56 (FIG. 2J). Namely, the insulating layers 44, 46, 48, 50, 58, 58, 60, 62, and 64 define an intermediate insulating layer structure or insulating interlayer structure of the aforesaid multi-layered wiring arrangement, indicated by reference 74 (FIG. 2L), in which the copper via-plugs 56 and copper wiring pattern 72 are formed.

If necessary, at least one insulating interlayer structure having copper via-plugs and a copper wiring pattern is further formed on the insulating interlayer structure 74 in substantially the same manner as mentioned above, and an uppermost insulating layer structure having copper via-plugs and a copper wiring pattern is finally formed thereon. Of course, the formation of the uppermost insulating layer structure is carried out in substantially the same manner as mentioned above.

In the aforesaid first embodiment of the production method according to the present invention, the second SiOCH layers 30, 48, and 62 are obtained by the He-plasma treatment and the thermal oxidization treatment using the N$_2$O-plasma. However, a plasma treatment using an inert gas, such as an argon (Ar) gas, may be substituted for the He-plasma treatment, provided that oxygen (O), nitrogen (N), and hydrogen (H) are not included in the processing chamber 12 of the CVD apparatus shown in FIG. 1. Also, although the nitrous oxide (N$_2$O) gas is used in the thermal oxidization treatment, another gas containing oxygen (O), such as an oxygen (O$_2$) gas, an ozone (O$_3$) gas, an nitrogen monoxide (NO) gas, a carbon monoxide (CO) gas, a carbon dioxide (CO$_2$) gas or the like, may be substituted for the nitrous oxide (N$_2$O) gas.

Also, in the aforesaid first embodiment of the production method, each of the SiCNH layer 26, 44, and 58 may be replaced with a SiCH layer, a SiNH layer or the like. On the other hand, after the formation of the SiCNH layer (26, 44, 58), either a SiOCNH layer or a SiCH layer may be formed on the SiCNH layer (26, 44, 58) so as to be intervened between the SiCNH layer (26, 44, 58) and the SiOCH layer (28, 46, 60), for the purpose of improving an adhesion property therebetween.

Further, in the aforesaid first embodiment of the production method, although the SiH$_4$ gas and the N$_2$O gas are used to form the SiO$_2$ layer (32, 50, 64) on the second SiOCH layer (30, 48, 62), a TEOS (tetraethoxysilane) gas and either an oxygen gas (O$_2$) or an ozone gas (O$_3$) may be substituted for the SiH$_4$ gas and the N$_2$O gas.

Furthermore, in the aforesaid first embodiment of the production method, although the Ta/TaN layer 38 is used as the barrier metal layer, either a Ta layer or a TaN layer may be substituted for the Ta/TaN layer 38. Also, another tantalum compound, such as TaSiN or the like, may be used for the barrier metal layer, and the TaSiN layer may be associated with either the Ta layer or the TaN layer. On the other hand, the barrier metal layer may be formed of titanium (Ti) or a titanium compound, such as TiN, TiSiN or the like, and one of Ti, TiN, and TiSiN layers may be associated with another layer.

Preferably, the copper material used for forming the wiring patterns 40 and 72 and the via-plugs 56 should contain at least one anti-migration substance selected from a group including silicon (Si), aluminum (Al), tungsten (W), magnesium (Mg), beryllium (Be), zinc (Zn), lead (Pb), cadmium (Cd), gold (Au), mercury (Hg), platinum (Pt), zirconium (Zr), titanium (Ti), tin (Sn), nickel (Ni), and iron (Fe).

The inventors carried out tests for comparing the He-plasma treatment according to the present invention with respective conventional plasma treatments using a nitrous oxide (N$_2$O) gas, a nitrogen hydride (NH$_3$) gas, and a hydrogen (H$_2$) gas. First, a plurality of test samples were prepared, and each test sample included a silicon substrate, and a SiOCH layer formed thereon and having a thickness of approximately 500 nm. Then, by using a plasma CVD apparatus as shown in FIG. 1, a test sample was treated with N$_2$O-plasma; another test sample was treated with NH$_3$-plasma; yet another test sample was treated with H$_2$-plasma; and still yet another test sample was treated with He-plasma.

After the plasma treatments are completed, shrinkage degrees, refractive indexes, and k-values (i.e., dielectric constants) of the treated SiOCH layers of the test samples were measured. The measurement results are shown in graphs of FIGS. 3A, 3B, and 3C.

Figure 3A:
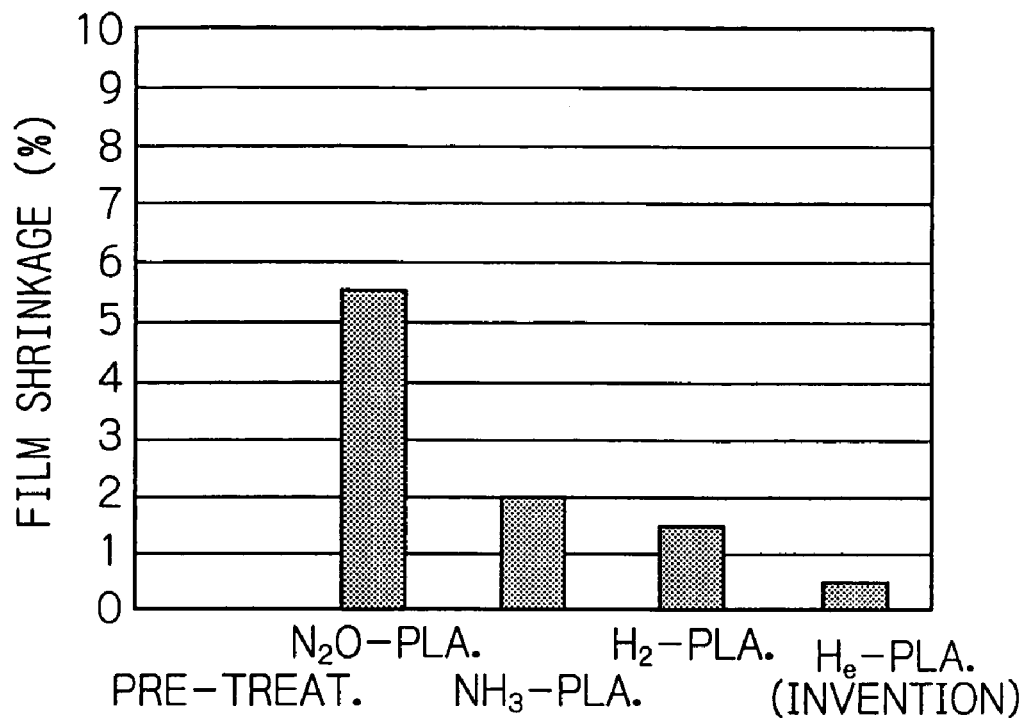
FIG. 3A is a graph showing shrinkage degrees of SiOCH layers subjected to conventional plasma treatments and a He-plasma treatment according to the present invention.

In the graph of FIG. 3A, each of the shrinkage degrees of the treated SiOCH layers is expressed as a percentage. Of course, a shrinkage degree of the SiOCH layer in a pre-treatment is defined as zero percent. As is apparent from the graph of FIG. 3A, the SiOCH layer of the test sample, treated with the He-plasma according to the present invention, exhibited the smallest shrinkage degree (approximately 0.5%).

Figure 3B:
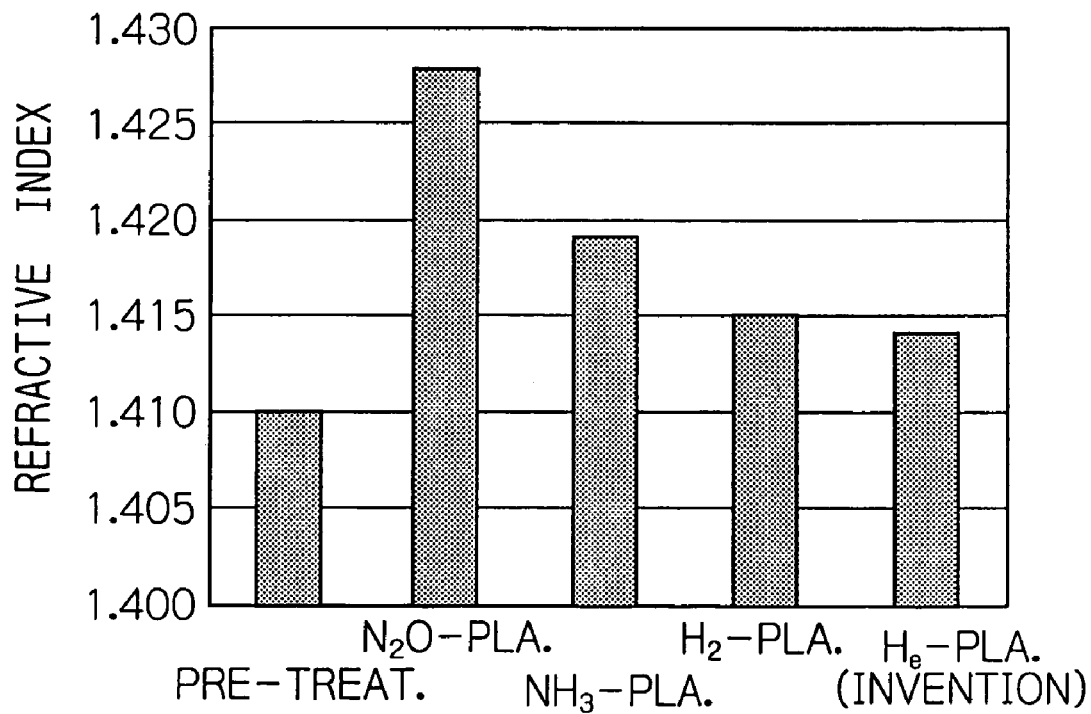
FIG. 3B is a graph showing reflective indexes of the SiOCH layers subjected to the conventional plasma treatments and the He-plasma treatment according to the present invention.

Also, as is apparent from the graph of FIG. 3B, although the reflective indexes of the treated SiOCH layers were increased in comparison with the reflective index (1.410) of the SiOCH layer in the pre-treatment, the SiOCH layer of the test sample, treated with the He-plasma according to the present invention, exhibited the smallest reflective index (approximately 1.414).

Figure 3C:
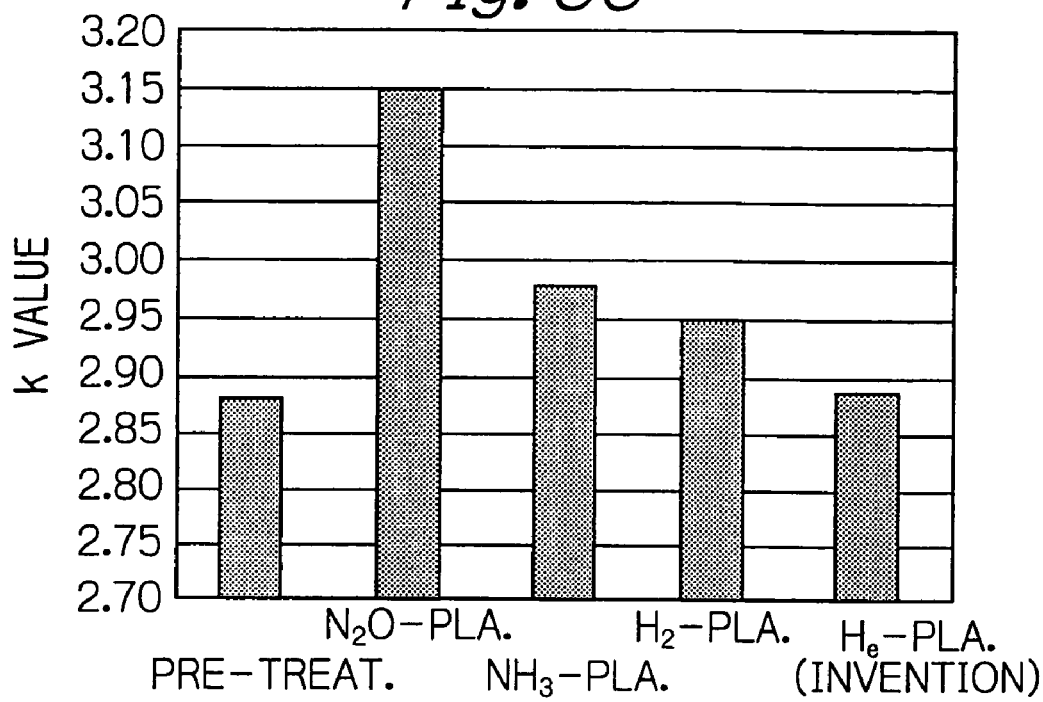
FIG. 3C is a graph showing k-values (dielectric constants) of the SiOCH layers subjected to the conventional plasma treatments and the He-plasma treatment according to the present invention.

Further, as is apparent from the graph of FIG. 3C, although the k-values of the treated SiOCH layers were increased in comparison with the k-value (2.88) of the SiOCH layer in the pre-treatment, the SiOCH layer of the test sample, treated with the He-plasma according to the present invention, exhibited the smallest k-value (approximately 2.89).

As is apparent from the graphs of FIGS. 3A, 3B, and 3C, when the respective SiOCH layers treated with the $N_2O$-plasma, $NH_3$-plasma, and $H_2$-plasma, the variations of the shrinkage degrees, reflective indexes, and k-values of the treated SiOCH layers are very large, because the respective SiOCH layers are deeply oxidized, nitrided and reduced due to the $N_2O$-plasma treatment, $NH_3$-plasma treatment, and $H_2$-plasma treatment. As a result, the respective SiOCH layers may be wholly reformed and modified by the $N_2O$-plasma treatment, $NH_3$-plasma treatment, and $H_2$-plasma treatment.

On the other hand, when the SiOCH layer is treated with the He-plasma according to the present invention, a part of the Si—$CH_3$ bonds and a part of Si—H bonds are released to thereby produce dangling bonds in only a surface section of the SiOCH layer, and thus the variations of the shrinkage degree, reflective index, and k-value of the He-plasma-treated SiOCH layer are very small.

Figure 4:
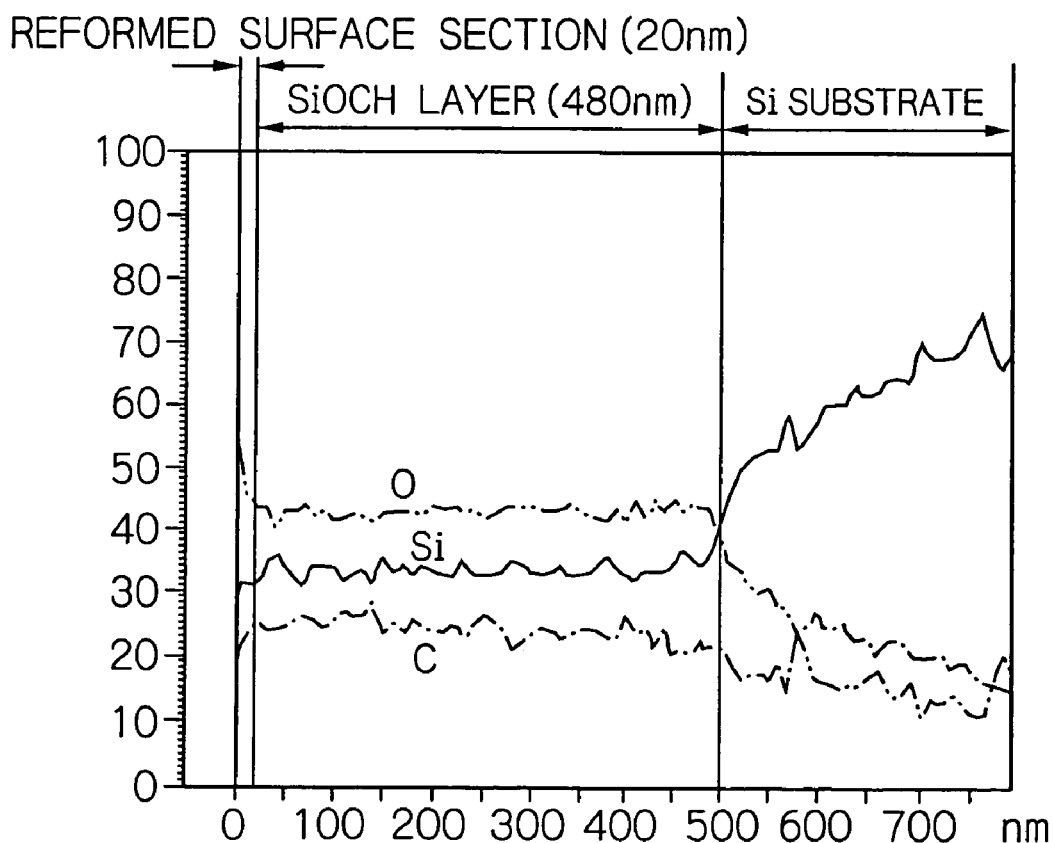
FIG. 4 is a graph showing a carbon (C) density, a silicon (Si) density, and an oxygen (O) density of the SiOCH layer subjected to the He-plasma treatment according to the present invention.

The test sample treated with the He-plasma was further subjected to a thermal oxidization treatment using $N_2O$-plasma, such that the He-plasma-treated surface section of the SiOCH layer was further reformed and modified. Thereafter, by using an X-ray photoelectron spectroscopy (XPS) apparatus, a carbon (C) density, a silicon (Si) density, and an oxygen (O) density of the treated SiOCH layer were measured along the thickness thereof. The measurement results are shown in a graph of FIG. 4. As is apparent from this graph, in the reformed and modified surface section having a thickness of approximately 20 nm, the oxygen (O) density was lowered, and the carbon (C) density was raised, in comparison with an oxygen (O) density and a carbon (C) density of the SiOCH layer having a thickness of approximately 480 nm.

Note, although a hydrogen (H) density cannot be measured by using the XPS apparatus, it is obvious that the hydrogen (H) density is lowered in the reformed and modified surface section of the SiOCH layer, because the methyl radicals are decreased from the reformed and modified surface section of the SiOCH layer.

Also, in order to evaluate an adhesion strength between the second SiOCH layer (30, 48, 62) and the $SiO_2$ layer (32, 50, 64), adhesion strength tests were carried out by the inventors. Similar to the above-mentioned tests, a plurality of test samples were prepared, and each test sample included a silicon substrate, and a SiOCH layer formed thereon and having a thickness of approximately 500 nm.

A test sample was subjected to the $N_2O$-plasma treatment in the plasma CVD apparatus, and a silicon dioxide ($SiO_2$) layer was formed on the treated SiOCH layer of the test sample without the test sample's being taken out of the plasma CVD apparatus. Similarly, another test sample was subjected to the $NH_3$-plasma treatment in the plasma CVD apparatus, and a silicon dioxide ($SiO_2$) layer was formed on the treated SiOCH layer of the test sample without the test sample's being taken out of the plasma CVD apparatus. Further, yet another test sample was subjected to the $H_2$-plasma treatment in the plasma CVD apparatus, and a silicon dioxide ($SiO_2$) layer was formed on the treated SiOCH layer of the test sample without the test sample's being taken out of the plasma CVD apparatus.

On the other hand, a test sample was subjected to the He-plasma treatment and the thermal oxidization treatment (i.e., $N_2O$-plasma treatment) in the plasma CVD apparatus, and was taken out of the plasma CVD apparatus so as to be exposed to atmosphere. Then, a silicon dioxide ($SiO_2$) layer was formed on the treated SiOCH layer of the test sample in another plasma CVD apparatus. Also, another test sample was subjected to the He-plasma treatment and the thermal oxidization treatment (i.e., $N_2O$-plasma treatment) in the plasma CVD apparatus, and a silicon dioxide ($SiO_2$) layer was formed on the treated SiOCH layer of the test sample without the test sample's being taken out of the plasma CVD apparatus.

Thereafter, each of the test samples was subjected to a 4-point bending test, in which a load was applied to the test sample such that the $SiO_2$ layer and the SiOCH layer were torn from each other. The test results are shown in a graph of FIG. 5.

Figure 5:
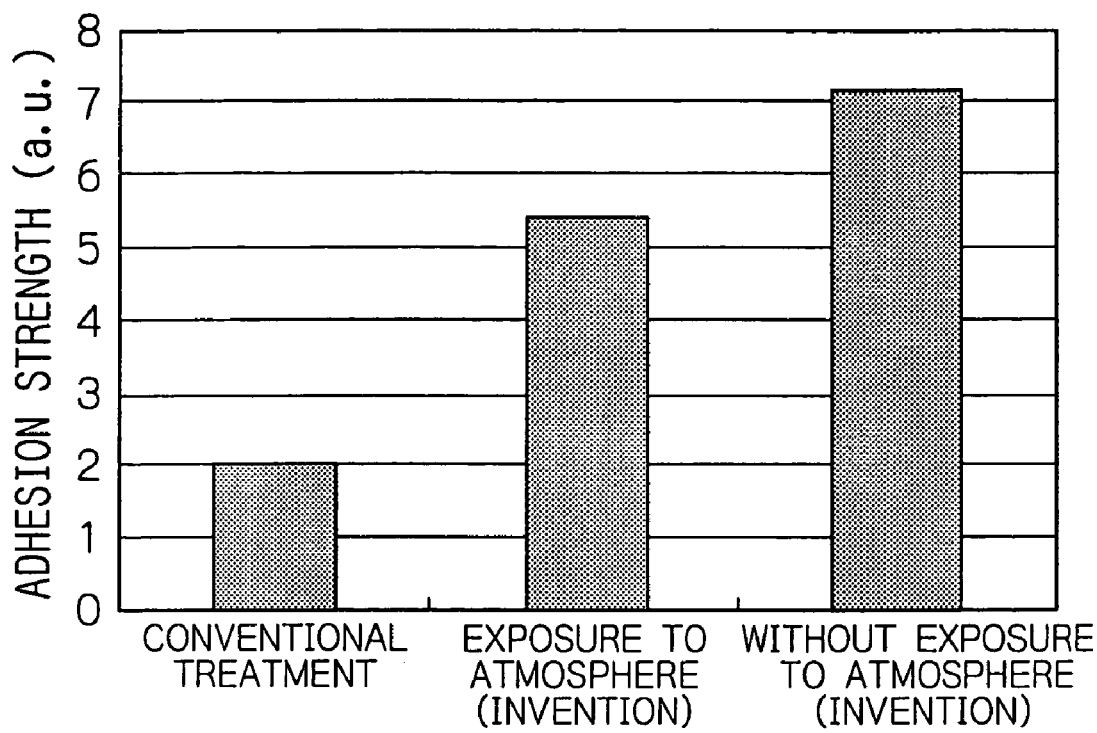
FIG. 5 is a graph showing an adhesion strength between a SiOCH layer subjected to a conventional plasma treatment and a $SiO_2$ layer formed thereon, an adhesion strength between an atmosphere-exposed SiOCH layer subjected to a He-plasma treatment according to the present invention and a $SiO_2$ layer formed thereon, and an adhesion strength between a non-atmosphere-exposed SiOCH layer subjected to a He-plasma treatment according to the present invention and a $SiO_2$ layer formed thereon.

When the SiOCH layer of the test sample was subjected to the conventional plasma treatment ($N_2O$-plasma, $NH_3$-plasma, $H_2$-plasma), the adhesion strength between the $SiO_2$ layer and the treated SiOCH layer was "2.03", as shown in the graph of FIG. 5.

On the other hand, when the SiOCH layer of the test sample was subjected to the He-plasma treatment and the thermal oxidization treatment according to the present invention, and when the $SiO_2$ layer was formed on the treated SiOCH layer after the treated SiOCH layer was exposed to the atmosphere, the adhesion strength between the $SiO_2$ layer and the treated SiOCH layer was "5.42", as shown in the graph of FIG. 5.

Also, when the SiOCH layer of the test sample was subjected to the He-plasma treatment and the thermal oxidization treatment according to the present invention, and when the $SiO_2$ layer was formed on the treated SiOCH layer without the treated SiOCH layer's being exposed to the atmosphere, the adhesion strength between the $SiO_2$ layer and the treated SiOCH layer was "7.16", as shown in the graph of FIG. 5.

As is apparent from the adhesion strength tests, according to the present invention, it is possible to considerably improve the adhesion strength between the $SiO_2$ layer and the treated SiOCH layer. Also, in the present invention, it is preferable to carry out the formation of the $SiO_2$ layer on the treated SiOCH layer without the treated SiOCH layer's being exposed to the atmosphere.

After the test sample is subjected to the He-plasma treatment and the thermal oxidization treatment in the plasma CVD apparatus, when it is taken out of the plasma CVD apparatus so as to be exposed to the atmosphere, the treated SiOCH layer of test sample traps moisture so that Si—OH bonds are produced in the treated SiOCH layer, resulting in decline in the adhesion strength between the $SiO_2$ layer and the treated SiOCH layer, in comparison with the case where the $SiO_2$ layer is formed on the treated SiOCH layer without the treated SiOCH layer's being exposed to the atmosphere.

In reality, an amount of moisture, which was trapped in the SiOCH layer of the test sample exposed to the atmosphere, and an amount of moisture, which was trapped in the SiOCH layer of the test sample not exposed to the atmosphere, were measured by using a thermal desorption spectroscopy (TDS) apparatus. The measurement results are shown in a graph of FIG. 6.

Figure 6:
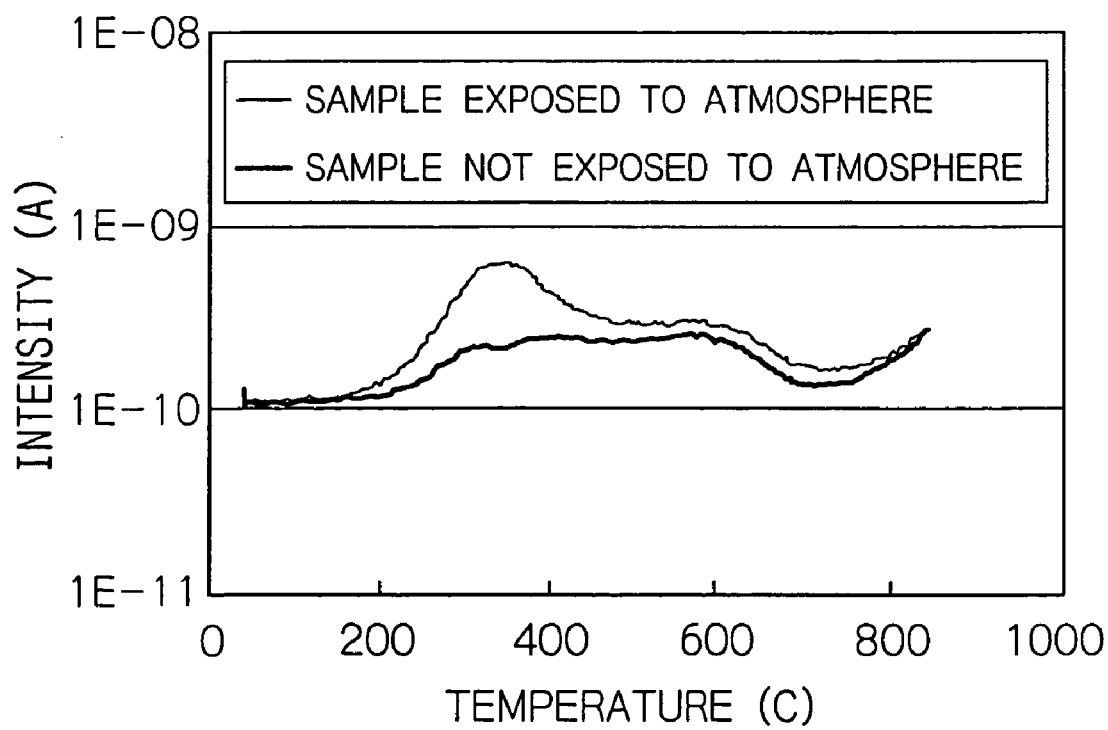
FIG. 6 is a graph showing an amount of moisture degassed from the atmosphere-exposed SiOCH layer and an amount of moisture degassed from the non-atmosphere-exposed SiOCH layer.

In the graph of FIG. 6, a thin line represents the amount of moisture degassed from the SiOCH layer of the test sample exposed to the atmosphere, and a thick line represents the amount of moisture degassed from the SiOCH layer of the test sample not exposed to the atmosphere. Note, in the graph of FIG. 6, the ordinate represents an value of electric current output from the TDS apparatus in proportion to a detected amount of moisture, and the abscissa represents a temperature of the heated test samples.

As is apparent from the graph of FIG. 6, the amount of moisture degassed from the SiOCH layer of the test sample not exposed to the atmosphere is smaller than the amount of moisture degassed from the SiOCH layer of the test sample exposed to the atmosphere. Thus, the adhesion strength between the $SiO_2$ layer and the treated SiOCH layer not exposed atmosphere is superior to the adhesion strength between the $SiO_2$ layer and the treated SiOCH layer exposed to the atmosphere.

Figure 7:
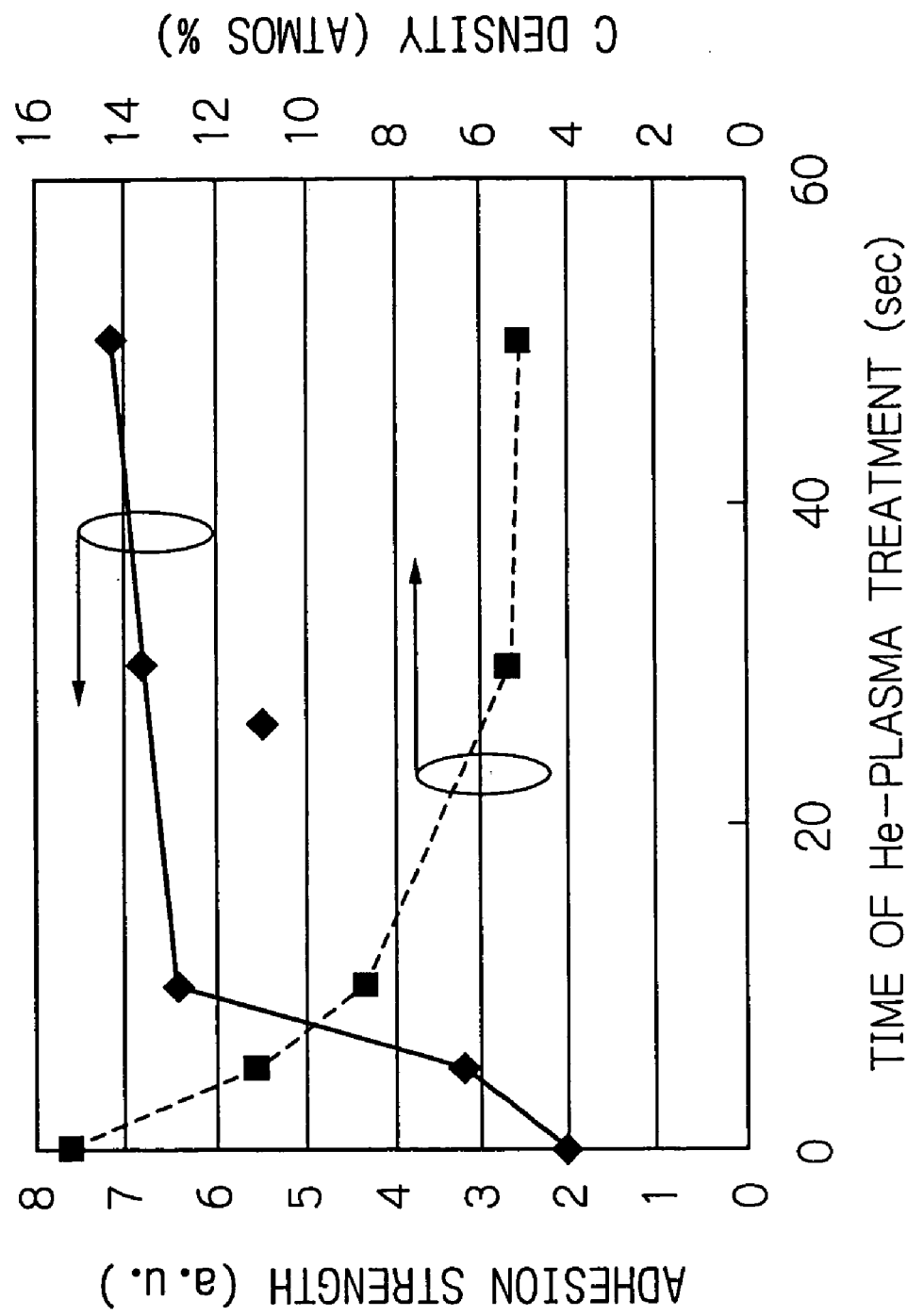
FIG. 7 is a graph showing a relationship among a time of a He-plasma treatment according to the present invention, a carbon (C) density of a SiOCH layer subjected to the He-plasma treatment, and an adhesion strength between the treated SiOCH layer and a $SiO_2$ layer formed thereon.

With reference to a graph of FIG. 7, a relationship among a time of the He-plasma treatment, a carbon (C) density of the treated SiOCH layer, and an adhesion strength between the $SiO_2$ layer and the treated SiOCH layer is shown. As is apparent from this graph, as the carbon (C) density of the treated SiOCH layer is lowered, the adhesion strength between the $SiO_2$ layer and the treated SiOCH layer is increased. In order to obtain the adhesion strength of more than "5.0", it is necessary to lower the carbon (C) density to less than 10 atoms %. Namely, it was found that the SiOCH layer should be subjected to the He-plasma treatment during at least 10 seconds before the sufficient adhesion strength of more than "5.0" can be obtained between the $SiO_2$ layer and the treated SiOCH layer.

When the carbon (C) density of the treated SiOCH layer is lowered to less than 10 atoms %, an oxygen (O) density of the treated SiOCH layer is raised to more than 35 atoms %, and a hydrogen (H) density of the treated SiOCH layer is lowered to less than 25 atoms %, resulting in an improvement in the adhesion strength between the $SiO_2$ layer and the treated SiOCH layer. Also, when the carbon (C) density has a percentage falling a range between approximately 10 atoms % and approximately 20 atoms %, when the oxygen (O) density has a percentage falling a range between approximately 20 atoms % and approximately 35 atoms %, and when the hydrogen (H) density is more than 25 atoms %, it is possible to suppress an undesirable increment of the k-value of the treated SiOCH layer.

FIGS. 8A to 8J show a second embodiment of a production method for manufacturing semiconductor devices according to the present invention. Note, in this second embodiment, a multi-layered wiring arrangement of each semiconductor device is formed, using a dual-damascene process.

Figure 8A:
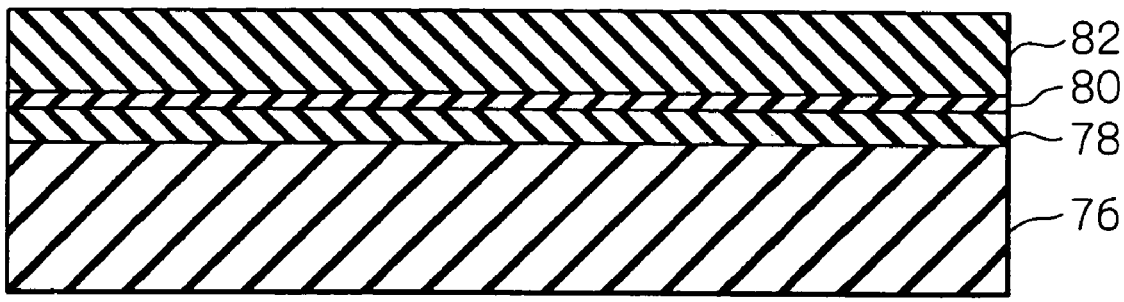
FIG. 8A is a partial cross-sectional view of an insulating underlayer formed on a semiconductor substrate, showing a first representative step of a second embodiment of a production method for manufacturing a semiconductor device according to the present invention.

With reference to FIG. 8A, reference 76 indicates an insulating underlayer formed on a semiconductor substrate or silicon wafer, as indicated by reference SW in FIG. 1, in which a plurality of semiconductor devices are produced. Note, although not illustrated in FIG. 8A, a plurality of metal plugs are formed in an area of the insulating underlayer 24 corresponding to each of the semiconductor devices, and are electrically connected to various active regions formed in a corresponding semiconductor device.

As shown in FIG. 8A, first, a SiCNH layer 78 having a thickness of approximately 50 nm is formed as an insulating layer on the insulating underlayer 24, using a suitable plasma CVD process. Then, a SiOCNH layer 80 having a thickness of approximately 10 nm is formed as an insulating layer on the SiCNH layer 78. Subsequently, a SiOCH layer 82 having a thickness of approximately 250 nm is formed as an insulating layer on the SiOCNH layer 80, using either a suitable plasma CVD process or a coating/baking process.

After the formation of the SiOCH layer 82 is completed, the silicon wafer SW, carrying the underlayer 76, the SiCNH layer 78, the SiOCNH layer 80, and the SiOCH layer 82, is mounted on the susceptor or lower electrode 16 of the CVD apparatus shown in FIG. 1, and a surface section of the SiOCH layer 82 is subjected to a He-plasma treatment using He-plasma, which is produced under the conditions as follows:

processing temperature: 200 to 450° C.;
flow rate of He gas: 10 to 6,000 sccm;
processing pressure: 1 to 20 Torr; and
RF power: 50 to 500 W.

Thus, a part of the Si—$CH_3$ bonds and a part of Si—H bonds are released to thereby produce dangling bonds in a surface section of the SiOCH layer 82.

Then, the surface section of the SiOCH layer 82 is further subjected to a thermal oxidization treatment using $N_2O$-plasma, which is produced under the conditions as follows:

processing temperature: 200 to 450° C.;
flow rate of $N_2O$ gas: 100 to 6,000 sccm;
processing pressure: 1 to 20 Torr; and
RF power: 50 to 500 W.

Figure 8B:
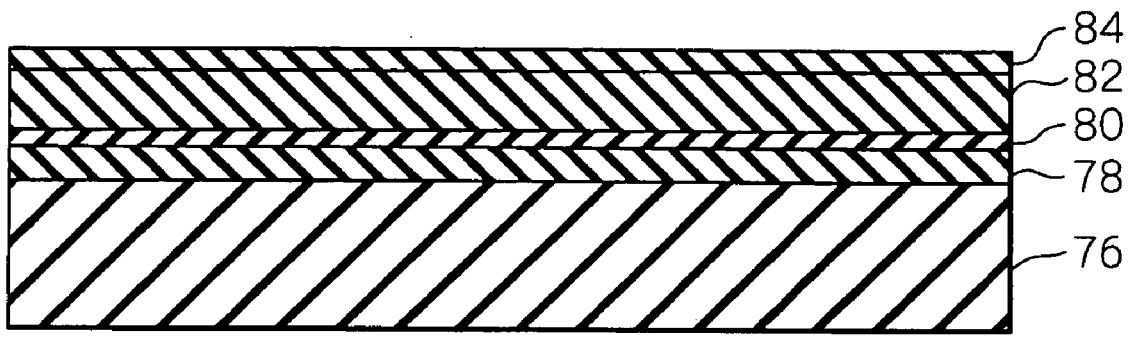
FIG. 8B is a partial cross-sectional view, similar to FIG. 8A, showing a second representative step of the second embodiment of the production process according to the present invention.

Thus, as shown in FIG. 8B, the surface section of the SiOCH layer 82 is reformed and modified as a second SiOCH layer 84, in which a carbon (C) density and a hydrogen (H) density are lowered, and in which an oxygen (O) density is raised. Under the aforesaid conditions, the second SiOCH layer 84 has a thickness of approximately 20 nm. Note, for the sake of convenience for explanation, the remaining section of the SiOCH layer 28 is defined as a first SiOCH layer 82.

Figure 8C:
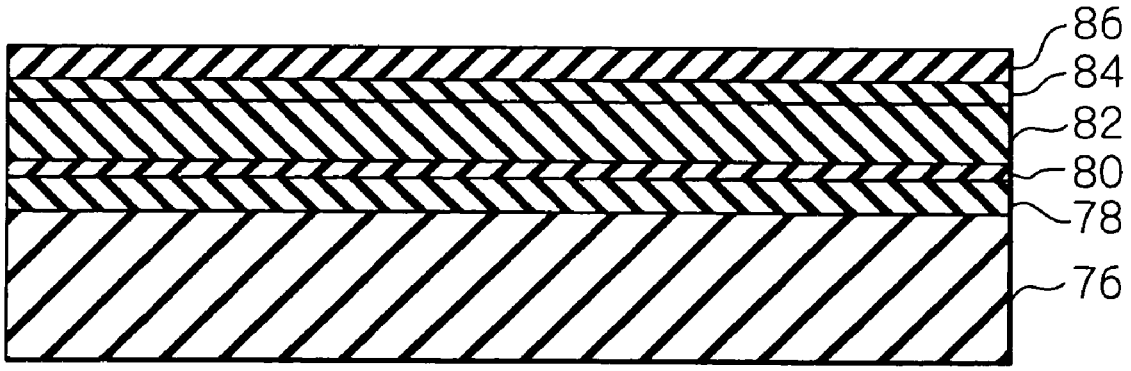
FIG. 8C is a partial cross-sectional view, similar to FIG. 8B, showing a third representative step of the second embodiment of the production process according to the present invention.

Subsequently, as shown in FIG. 8C, a silicon dioxide ($SiO_2$) layer 86 is formed as an insulating layer on the second SiOCH layer 84 by the plasma CVD apparatus shown in FIG. 1 under the conditions as follows:

processing temperature: 200 to 450° C.;
flow rate of $N_2O$ gas: 100 to 6,000 sccm;
flow rate of $SiH_4$ gas: 10 to 1,000 sccm;
processing pressure: 1 to 20 Torr; and
RF power: 50 to 500 W.

Figure 8D:
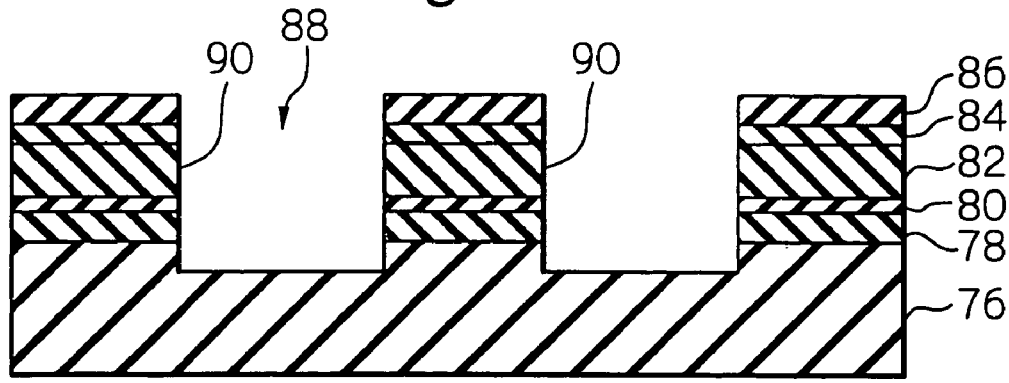
FIG. 8D is a partial cross-sectional view, similar to FIG. 8C, showing a fourth representative step of the second embodiment of the production process according to the present invention.

After the formation of the $SiO_2$ layer 86 is completed, the silicon wafer SW is taken out of the plasma CVD apparatus shown in FIG. 1. Then, as shown in FIG. 8D, a trench pattern 88, corresponding to a wiring pattern to be formed, is formed in the insulating layers 76, 78, 80, 82, 84, and 86, using a photolithography process and a dry etching process. The trench pattern 88 is formed by a plurality of fine trenches 90 corresponding to conductive paths included in the wiring pattern to be formed. Note, since both the SiCNH layer 78 and the SiOCNH layer 80 function as an etching stopping layer, it is possible to accurately carry out the formation of the fine trenches 90.

Figure 8E:
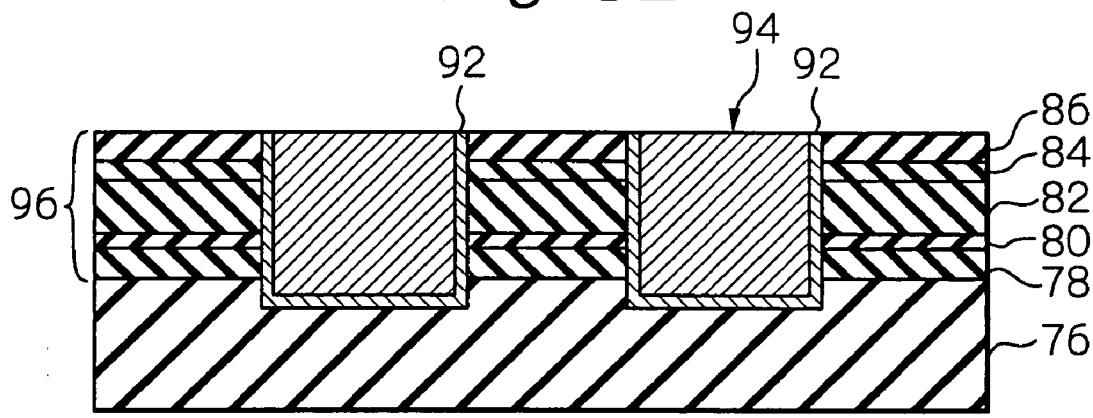
FIG. 8E is a partial cross-sectional view, similar to FIG. 8D, showing a fifth representative step of the second embodiment of the production process according to the present invention.

After the formation of the trench pattern 88 is completed, as shown in FIG. 8E, a tantalum/tantalum nitride (Ta/TaN) layer 92 having a thickness of approximately 30 nm is formed as a barrier metal layer on a side wall face and a bottom wall face defining each of the fine trenches 90. Then, a copper (Cu) layer having a thickness of approximately 100 nm is formed on the Ta/TaN layer 92, using a sputtering process. Subsequently, the fine trenches 90 are filled with copper (Cu), using an electroplating process in which the aforesaid Cu layer serves as a cathode electrode, and the filled copper (Cu) is subjected to an annealing process for crystallization at a temperature falling in a range between 200° C. and 400° C.

After the annealing process is completed, the silicon wafer SW is set in a chemical mechanical polishing (CMP) apparatus, the surface of the $SiO_2$ layer 86 is chemically and mechanically polished so that the redundant metals (Ta, TaN, Cu) are removed therefrom, resulting in formation of a copper wiring pattern 94 in the insulating layers 78, 80, 82, 84, and 86, as shown in FIG. 8E. Namely, the insulating layers 78, 80, 82, 84, and 86 define a lowermost insulating layer structure of the aforesaid multi-layered wiring arrangement, indicated by reference 96, in which the copper wiring pattern 94 is formed.

Note, of course, the barrier metal (Ta/TaN) layer 38 is provided for preventing diffusion of copper atoms (Cu) from the copper wiring pattern 94 into the insulating layers 76, 78, 80, 82, 84, and 86.

Figure 8F:
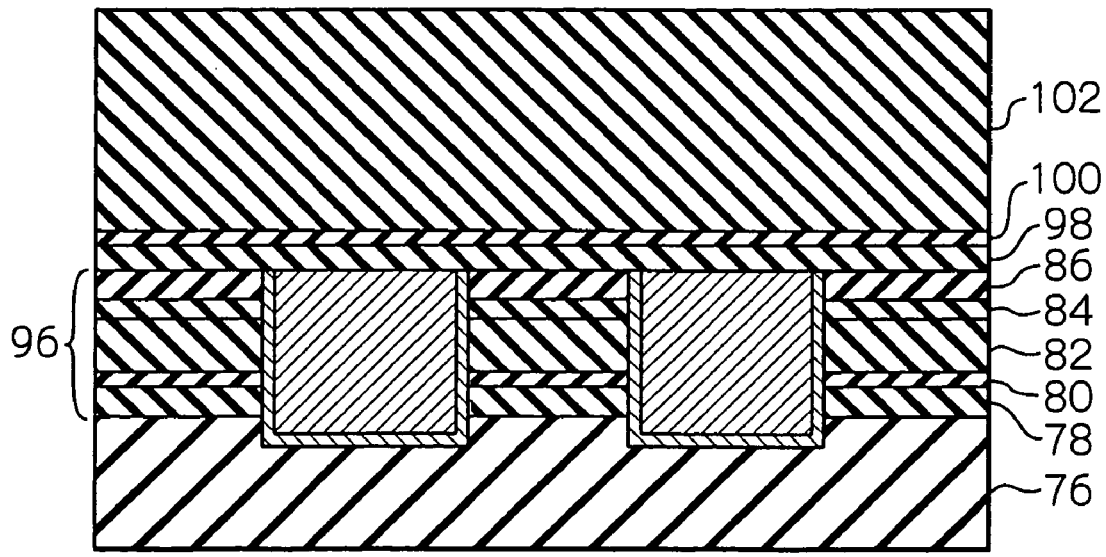
FIG. 8F is a partial cross-sectional view, similar to FIG. 8E, showing a sixth representative step of the second embodiment of the production process according to the present invention.

Next, as shown in FIG. 8F, a SiCNH layer 98 having a thickness of approximately 50 nm is formed as an insulating layer on the lowermost insulating layer structure 96. Then, a SiOCNH layer 100 having a thickness of approximately 10 nm is formed as an insulating layer on the SiCNH layer 98. Subsequently, a SiOCH layer 102 having a thickness of approximately 500 nm is formed as an insulating layer on the SiOCNH layer 100. Note, both the SiCNH layer 98 and the SiOCNH layer 100 function as a barrier insulating layer for preventing diffusion of the copper atoms (Cu) from the copper wiring pattern 94 into the first SiOCH layer 102.

Figure 8G:
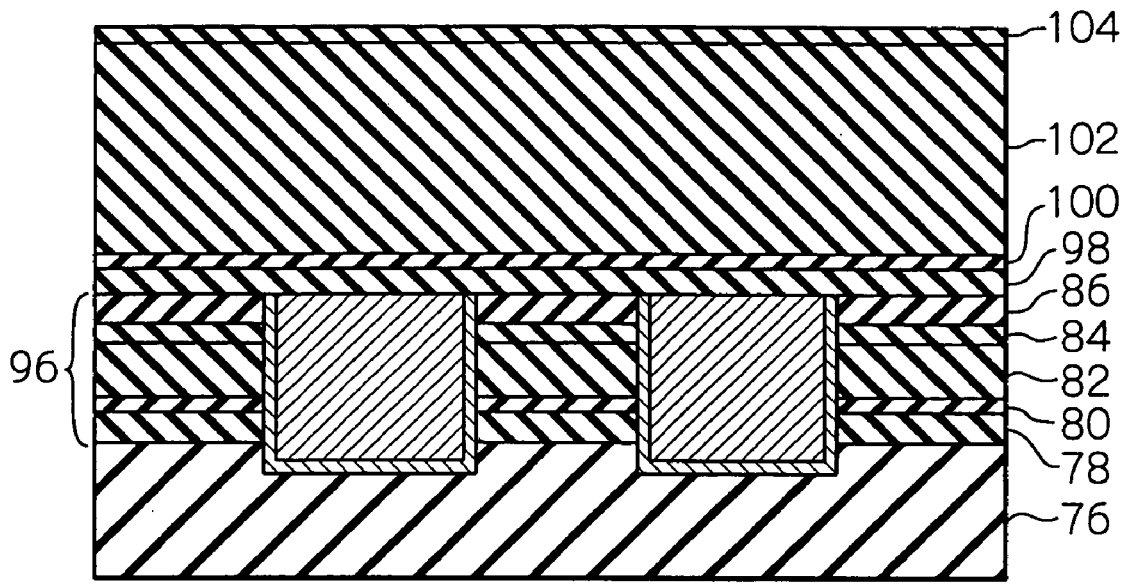
FIG. 8G is a partial cross-sectional view, similar to FIG. 8F, showing a seventh representative step of the second embodiment of the production process according to the present invention.

After the formation of the SiOCH layer 102 is completed, the silicon wafer SW is again mounted on the lower electrode 16 of the CVD apparatus shown in FIG. 1, and a surface section of the SiOCH layer 102 is subjected to substantially the same He-plasma treatment and thermal oxidization treatment as mentioned above. Thus, as shown in FIG. 8G, the surface section of the SiOCH layer 102, having a thickness of approximately 20 nm, is reformed and modified as a second SiOCH layer 104, in which a carbon (C) density and a hydrogen (H) density are lowered, and in which an oxygen (O) density is raised. Note, similar to the above-mentioned case, the remaining section of the SiOCH layer 102 is defined as a first SiOCH layer 102.

Figure 8H:
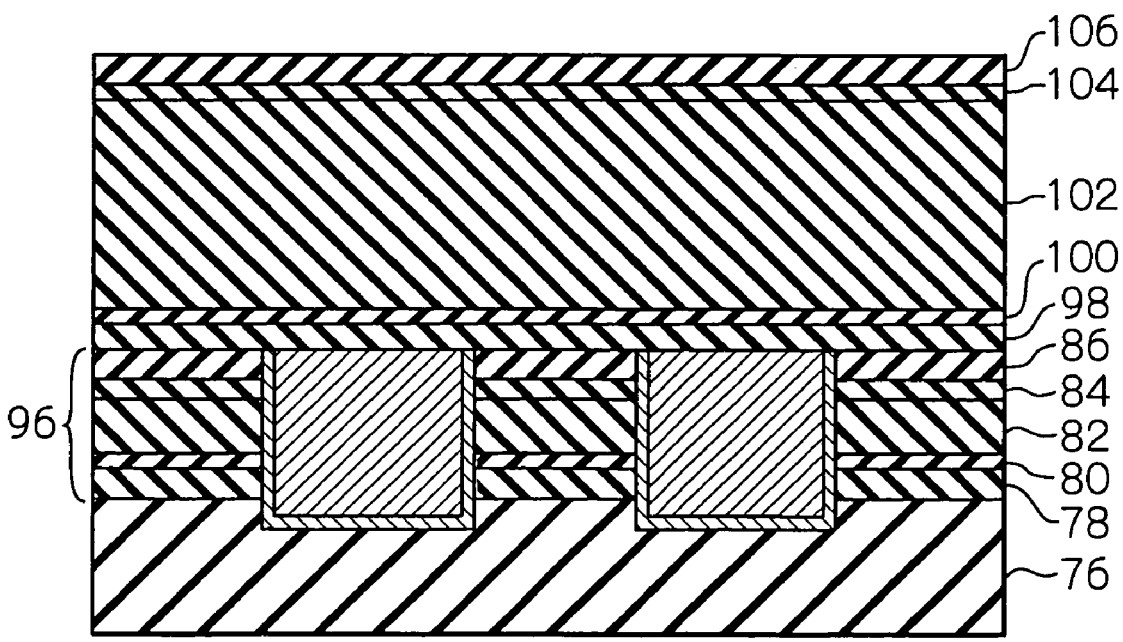
FIG. 8H is a partial cross-sectional view, similar to FIG. 8G, showing an eighth representative step of the second embodiment of the production process according to the present invention.
Figure 8I:
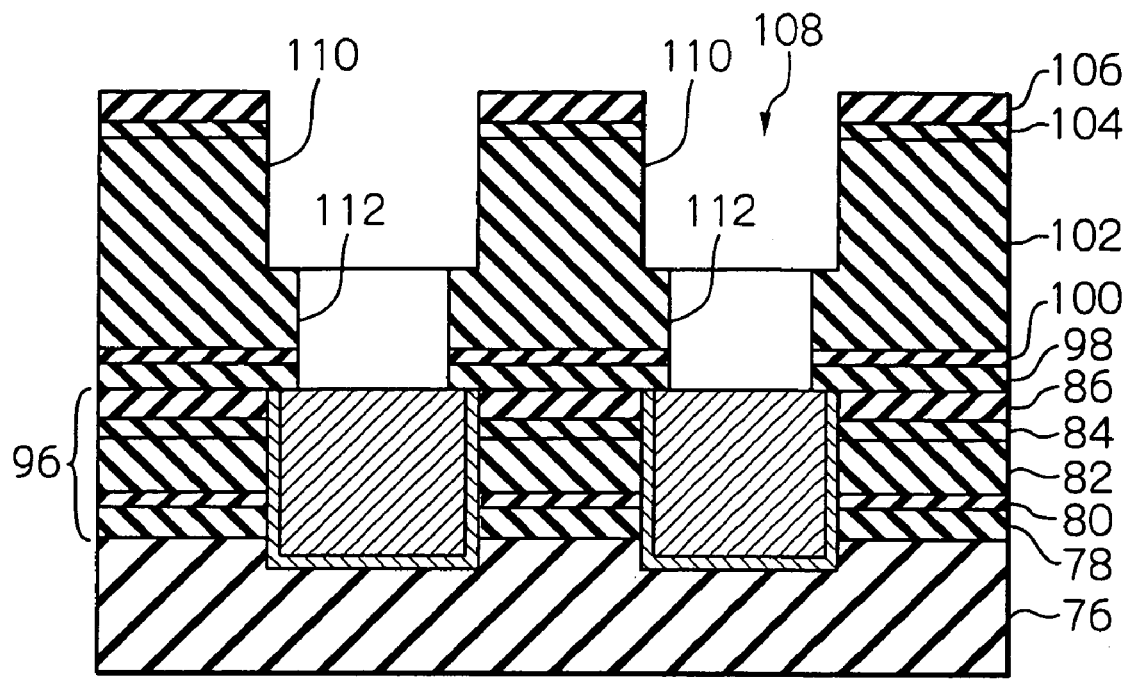
FIG. 8I is a partial cross-sectional view, similar to FIG. 8H, showing a ninth representative step of the second embodiment of the production process according to the present invention.

Subsequently, as shown in FIG. 8H, a silicon dioxide ($SiO_2$) layer 106 having a thickness of approximately 100 nm is formed as an insulating layer on the second SiOCH layer 104 by the plasma CVD apparatus shown in FIG. 1 in substantially the same manner as the $SiO_2$ layer 86.

After the formation of the $SiO_2$ layer 106 is completed, the silicon wafer SW is taken out of the plasma CVD apparatus shown in FIG. 1. Then, as shown in FIG. 8D, a trench pattern 108, corresponding to a wiring pattern to be formed, is formed in the insulating layers 102, 104, and 106. Of course, the trench pattern 108 is formed by a plurality of fine trenches 110 corresponding to conductive paths included in the wiring pattern to be formed. Further, a plurality of fine holes 112 are formed in the bottoms of the fine trenches 110 so as to pass through the insulating layers 102, 100, and 98 86, whereby a predetermined location of the copper wiring pattern 94 is exposed by each of the fine holes 112. The formation of the fine trenches 110 and holes 112 is carried out by using a photolithography process and a dry etching process. Note, since both the SiCNH layer 98 and the SiOCNH layer 100 also function as an etching stopping layer, it is possible to accurately carry out the formation of the fine trenches 110 and holes 112.

Figure 8J:
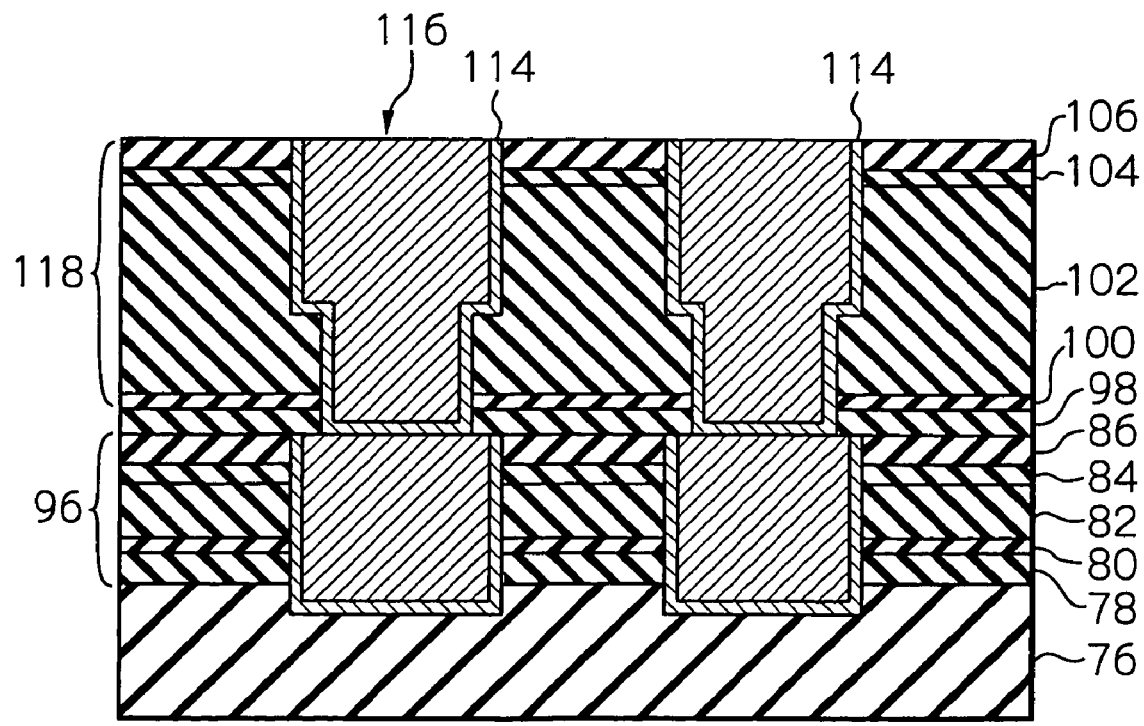
FIG. 8J is a partial cross-sectional view, similar to FIG. 8I, showing a tenth representative step of the second embodiment of the production process according to the present invention.

After the formation of the fine trenches 110 and holes 112 is completed, as shown in FIG. 8J, a tantalum/tantalum nitride (Ta/TaN) layer 114 having a thickness of approximately 30 nm is formed as a barrier metal layer on a side wall face and a bottom wall face defining each of the fine trenches 110 and on a side wall face and a bottom wall face defining each of the fine holes 112. Then, a copper (Cu) layer having a thickness of approximately 100 nm is formed on the Ta/TaN film 114, using a sputtering process. Subsequently, the fine trenches 110 and holes 112 are filled with copper (Cu), using an electroplating process in which the aforesaid Cu layer serves as a cathode electrode, and the filled copper (Cu) is subjected to an annealing process for crystallization at a temperature falling in a range between 200° C. and 400° C.

After the annealing process is completed, the silicon wafer SW is set in the aforesaid CMP apparatus, the surface of the $SiO_2$ layer 106 is chemically and mechanically polished so that the redundant metals (Ta, TaN, Cu) are removed therefrom, resulting in formation of a copper wiring pattern 116 with copper via-plugs (corresponding to the fine holes 112) in the insulating layers 98, 100, 102, 104, and 106, as shown in FIG. 8J. Thus, the copper wiring pattern 116 is electrically connected to the copper wiring pattern 94 through the intermediary of the copper via-plugs. Namely, the insulating layers 98, 100, 102, 104, and 106 define an intermediate insulating layer structure or insulating interlayer structure of the aforesaid multi-layered wiring arrangement, indicated by reference 118 (FIG. 8J), in which the copper wiring pattern 116 with the copper via-plugs is formed.

If necessary, at least one insulating interlayer structure having a copper wiring pattern with copper via-plugs is further formed on the insulating interlayer structure 118 in substantially the same manner as mentioned above, and an uppermost insulating layer structure having a copper wiring pattern with copper via-plugs is finally formed thereon. Of course, the formation of the uppermost insulating layer structure is carried out in substantially the same manner as mentioned above.

Finally, it will be understood by those skilled in the art that the foregoing description is of preferred embodiments of the methods and devices, and that various changes and modifications may be made to the present invention without departing from the spirit and scope thereof.

The invention claimed is:

1. A semiconductor device comprising:
   a semiconductor substrate; and
   a multi-layered wiring arrangement provided on said semiconductor substrate, said multi-layered wiring arrangement including at least one insulating layer structure having a metal wiring constitution formed therein,
   wherein said insulating layer structure includes a first SiOCH layer, a second SiOCH layer formed on said first SiOCH layer, and a silicon dioxide ($SiO_2$) layer formed on said second SiOCH layer, and said second SiOCH layer features a carbon (C) density lower than that of said first SiOCH layer, a hydrogen (H) density lower than that of said first SiOCH layer, and an oxygen (O) density higher than that of said first SiOCH layer.

2. A semiconductor device as set forth in claim 1, wherein said first SiOCH layer features the carbon (C) density falling in a range between 10 atoms % and 20 atoms %, the oxygen (O) density falling in a range between 20 atoms % and 35 atoms %, and the hydrogen (H) density of more than 25 atoms %, and said second SiOCH layer features the carbon (C) density of less than 10 atoms %, the oxygen (O) density of more than 35 atoms %, and the hydrogen (H) density of less than 25 atoms %.

3. A semiconductor device as set forth in claim 1, wherein said insulating layer structure has a trench pattern formed therein, and said metal wiring constitution comprises a metal wiring pattern buried in said trench pattern.

4. A semiconductor device as set forth in claim 3, wherein said metal wiring pattern is made of copper (Cu), and a barrier metal layer is formed on wall faces defining said trench pattern to thereby prevent diffusion of copper atoms from said copper wiring pattern into said insulating layer structure.

5. A semiconductor device as set forth in claim 4, wherein said barrier metal layer has a single-layered structure, which is formed of one selected from a group consisting of titanium (Ti), a titanium compound, tantalum (Ta), and a tantalum compound.

6. A semiconductor device as set forth in claim 5, wherein said titanium compound is either titanium nitride (TiN) or titanium silicon nitride (TiSiN), and said tantalum compound (Ta) is either tantalum nitride (TaN) or tantalum silicon nitride (TaSiN).

7. A semiconductor device as set forth in claim 4, wherein said barrier metal layer has a multi-layered structure, which is formed of more than one selected from a group consisting of titanium (Ti), a titanium compound, tantalum (Ta), and a tantalum compound.

8. A semiconductor device as set forth in claim 7, wherein said titanium compound is either titanium nitride (TiN) or titanium silicon nitride (TiSiN), and said tantalum compound (Ta) is either tantalum nitride (TaN) or tantalum silicon nitride (TaSiN).

9. A semiconductor device as set forth in claim 4, wherein said insulating layer structure further includes a barrier insulating layer on which said first SiOCH layer is formed, and said barrier insulating layer prevents diffusion of copper atoms into said first SiOCH layer when said insulating layer structure is formed on another insulating layer structure having a copper wiring constitution.

10. A semiconductor device as set forth in claim 9, wherein said barrier insulating layer has a single-layered structure comprising either a SiCNH layer or a SiCH layer.

11. A semiconductor device as set forth in claim 9, wherein said barrier insulating layer has a multi-layered structure comprising a SiCNH layer and a SiCH layer.

12. A semiconductor device as set forth in claim 9, wherein said barrier insulating layer has a multi-layered structure comprising a SiCNH layer, and a SiOCNH layer formed thereon.

13. A semiconductor device as set forth in claim 9, wherein said barrier insulating layer has a multi-layered structure comprising a SiCNH layer, and a SiCH layer formed thereon.

14. A semiconductor device as set forth in claim 4, wherein said copper wiring pattern contains at least one anti-migration substance selected from a group consisting of silicon (Si), aluminum (Al), tungsten (W), magnesium (Mg), beryllium (Be), zinc (Zn), lead (Pb), cadmium (Cd), gold (Au), mercury (Hg), platinum (Pt), zirconium (Zr), titanium (Ti), tin (Sn), nickel (Ni), and iron (Fe).

15. A semiconductor device as set forth in claim 1, wherein said insulating layer structure has at least one hole formed therein, and said metal wiring constitution comprises a metal via-plug buried in said hole.

16. A semiconductor device as set forth in claim 15, wherein said metal via-plug is made of copper (Cu), and a barrier metal layer is formed on wall faces defining said hole to thereby prevent diffusion of copper atoms from said copper via-plug into said insulating layer structure.

17. A semiconductor device as set forth in claim 16, wherein said barrier metal layer has a single-layered structure, which is formed of one selected from a group consisting of titanium (Ti), a titanium compound, tantalum (Ta), and a tantalum compound.

18. A semiconductor device as set forth in claim 17, wherein said titanium compound is either titanium nitride (TiN) or titanium silicon nitride (TiSiN), and said tantalum compound (Ta) is either tantalum nitride (TaN) or tantalum silicon nitride (TaSiN).

19. A semiconductor device as set forth in claim 16, wherein said barrier metal layer has a multi-layered structure, which is formed of more than one selected from a group consisting of titanium (Ti), a titanium compound, tantalum (Ta), and a tantalum compound.

20. A semiconductor device as set forth in claim 19, wherein said titanium compound is either titanium nitride (TiN) or titanium silicon nitride (TiSiN), and said tantalum compound (Ta) is either tantalum nitride (TaN) or tantalum silicon nitride (TaSiN).

21. A semiconductor device as set forth in claim 16, wherein said insulating layer structure further includes a barrier insulating layer on which said first SiOCH layer is formed, and said barrier insulating layer prevents diffusion of copper atoms into said first SiOCH layer when said insulating layer structure is formed on another insulating layer structure having a copper wiring constitution.

22. A semiconductor device as set forth in claim 21, wherein said barrier insulating layer has a single-layered structure comprising either a SiCNH layer or a SiCH layer.

23. A semiconductor device as set forth in claim 21, wherein said barrier insulating layer has a multi-layered structure comprising a SiCNH layer and a SiCH layer.

24. A semiconductor device as set faith in claim 21, wherein said barrier insulating layer has a multi-layered structure comprising a SiCNH layer, and a SiOCNH layer formed thereon.

25. A semiconductor device as set forth in claim 21, wherein said barrier insulating layer has a multi-layered structure comprising a SiCNH layer, and a SiCH layer formed thereon.

26. A semiconductor device as set forth in claim 16, wherein said copper via-plug contains at least one anti-migration substance selected from a group consisting of silicon (Si), aluminum (Al), tungsten (W), magnesium (Mg), beryllium (Be), zinc (Zn), lead (Pb), cadmium (Cd), gold (Au), mercury (Hg), platinum (Pt), zirconium (Zr), titanium (Ti), tin (Sn), nickel (Ni), and iron (Fe).

27. A semiconductor device as set forth in claim 1, wherein said second SiOCH layer has a smaller thickness than that of said first SiOCH layer.

28. A semiconductor device comprising:
a semiconductor substrate; and
a multi-layered wiring arrangement provided on said semiconductor substrate, said multi-layered wiring arrangement including at least one insulating layer structure having a metal wiring constitution formed therein,
wherein said insulating layer structure includes a first SiOCH layer, a second SiOCH layer formed on said first SiOCH layer, and a silicon dioxide ($SiO_2$) layer formed on said second SiOCH layer, and said second SiOCH layer features a carbon (C) density lower than that of said first SiOCH layer, a hydrogen (H) density lower than that of said first SiOCH layer, and an oxygen (O) density higher than that of said first SiOCH layer, wherein said first SiOCH layer features the carbon (C) density falling in a range between 10 atoms % and 20 atoms %, the oxygen (O) density falling in a range between 20 atoms % and 35 atoms %, and the hydrogen (H) density of more than 25 atoms %, and said second SiOCH layer features the carbon (C) density of less than 10 atoms %, the oxygen (O) density of more than 35 atoms %, and the hydrogen (H) density of less than 25 atoms %.

29. A semiconductor device as set forth in claim 28, wherein said second SiOCH layer has a smaller thickness than that of said first SiOCH layer.

30. A semiconductor device comprising:
a semiconductor substrate; and
a multi-layered wiring arrangement provided on said semiconductor substrate, said multi-layered wiring arrangement including at least one insulating layer structure having a metal wiring constitution formed therein,
wherein said insulating layer structure includes a first SiOCH layer, a second SiOCH layer formed on said first SiOCH layer, and a silicon dioxide ($SiO_2$) layer formed on said second SiOCH layer, and said second SiOCH layer features a carbon (C) density lower than that of said first SiOCH layer, a hydrogen (H) density lower than that of said first SiOCH layer, and an oxygen (O) density higher than that of said first SiOCH layer, wherein said insulating layer structure has a trench pattern formed therein, and said metal wiring constitution comprises a metal wiring pattern buried in said trench pattern, wherein said metal wiring pattern is made of copper (Cu), and a barrier metal layer is formed on wall faces defining said trench pattern to thereby prevent diffusion of copper atoms from said copper wiring pattern into said insulating layer structure, wherein said insulating layer structure further includes a barrier insulating layer on which said first SiOCH layer is formed, and said barrier insulating layer prevents diffusion of copper atoms into said first SiOCH layer when said insulating layer structure is formed on another insulating layer structure having a copper wiring constitution, wherein said barrier insulating layer has a multi-layered structure selected from the group comprising one of (a) a SICNH layer and a SiCH layer, (b) a SiCNH layer, and a SiOCNH layer formed thereon, and (c) a SiCNH layer, and a SiCH layer formed thereon.

31. A semiconductor device as set forth in claim 30, wherein said second SiOCH layer has a smaller thickness than that of said first SiOCH layer.

32. A semiconductor device comprising:
a semiconductor substrate; and
a multilayered wiring arrangement provided on said semiconductor substrate, said multi-layered wiring arrangement including at least one insulating layer structure having a metal wiring constitution formed therein,
wherein said insulating layer structure includes a first SiOCH layer, a second SiOCH layer formed on said first SiOCH layer, and a silicon dioxide ($SiO_2$) layer formed on said second SiOCH layer, and said second SiOCH layer features a carbon (C) density lower than that of said first SiOCH layer, a hydrogen (H) density lower than that of said first SiOCH layer, and an oxygen (O) density higher than that of said first SiOCH layer, wherein said insulating layer structure has at least one hole formed therein, and said metal wiring constitution comprises a metal via-plug buried in said hole, wherein said metal via-plug is made of copper (Cu), and a barrier metal layer is formed on wall faces defining said hole to thereby prevent diffusion of copper atoms from said copper via-plug into said insulating layer structure, wherein said insulating layer structure further includes a barrier insulating layer on which said first SiOCH layer is formed, and said barrier insulating layer prevents diffusion of copper atoms into said first SiOCH layer when said insulating layer structure is formed on another insulating layer structure having a copper wiring constitution, wherein said barrier insulating layer has a multi-layered structure comprising one of (a) a SiCNH layer and a SiCH layer, (b) a SiCNH layer, and a SiOCNH layer formed thereon, (c) a SiCNH layer, and a SiCH layer formed thereon.

33. A semiconductor device as set forth in claim 32, wherein said second SiOCH layer has a smaller thickness than that of said first SiOCH layer.

* * * * *